United States Patent
Ohmi et al.

(10) Patent No.: US 6,585,851 B1
(45) Date of Patent: Jul. 1, 2003

(54) PLASMA ETCHING DEVICE

(75) Inventors: Tadahiro Ohmi, 1-17-301, Komegabukuro 2 chome, Aoba-ku, Sendai-shi, Miyagi-ken 980-0813 (JP); Masaki Hirayama, Miyagi-ken (JP); Haruyuki Takano, Miyagi-ken (JP); Yusuke Hirayama, Yamanashi-ken (JP)

(73) Assignees: Tadahiro Ohmi, Miyagi-ken (JP); Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/380,520

(22) PCT Filed: Mar. 5, 1998

(86) PCT No.: PCT/JP98/00921
§ 371 (c)(1),
(2), (4) Date: Nov. 26, 1999

(87) PCT Pub. No.: WO98/39500
PCT Pub. Date: Sep. 11, 1998

(30) Foreign Application Priority Data

Mar. 7, 1997 (JP) ............................... 9-070432

(51) Int. Cl.[7] ........................ C23F 1/08; H01L 21/306
(52) U.S. Cl. ..................... 156/345.46; 156/345.45; 156/345.43; 156/345.47; 118/723 E
(58) Field of Search ............... 188/723 R, 723 MR, 188/723 E; 156/345; 204/298.16, 298.2, 298.28; 335/212

(56) References Cited

U.S. PATENT DOCUMENTS 5,659,276 A * 8/1997 Miyata ...................... 336/98
5,708,556 A * 1/1998 Van Os et al. ............. 361/234

FOREIGN PATENT DOCUMENTS

| JP | 4-324631 A | 11/1992 | ......... H01L/21/302 |
| JP | 5-29270 A | 2/1993 | ......... H01L/21/302 |
| JP | 09186141 A | 7/1997 | ....... H01L/21/3065 |

* cited by examiner

Primary Examiner—Gregory Mills
Assistant Examiner—Rudy Zervigon
(74) Attorney, Agent, or Firm—Randall J. Knuth

(57) ABSTRACT

A plasma etching device which has an auxiliary electrode enabling realization of a uniform plasma density of generated plasma on the surface of a base and which enables uniform etching with respect to the base without depending upon pressure and without rotating a magnetic field applying means. The plasma etching device has magnetic field applying means which has two parallel plate electrodes I and II and RF power applying means, with the base set on the electrode I, and which is horizontal and unidirectional with respect to the surface of the base where plasma etching is carried out. In this plasma etching device, an auxiliary electrode is provided at least on the upstream side of the base in a flow of electron current generated by the magnetic field applying means. The auxiliary electrode includes a local electrode arranged on the side facing the electrode II and means for adjusting impedance provided at a part of the local electrode to be electrically connected with the electrode I.

26 Claims, 32 Drawing Sheets

US 6,585,851 B1

PLASMA ETCHING DEVICE

TECHNICAL FIELD

The present invention relates to a plasma etching device. More specifically, the present invention relates to a plasma etching device that can freely control plasma density generated on the surface of a base, and/or a self bias potential on the surface of the base.

BACKGROUND OF THE INVENTION

Recently, accompanying the increase in chip size of DRAM, MPU etc., there has also been a tendency to increase the diameter of a silicon substrate used as a substrate for these devices. In the field of semiconductor manufacture, etching of an oxide film or polysilicon etc. is one of the most important steps, but with a normal parallel RIE device that was used formerly it was not possible to achieve plasma performance (for example, process pressure of less than 50 mTorr, ion saturation current of at least 1 mA/cm$^2$ (electron density of at least $1 \times 10^{10}$cm$^{-3}$)) required for fine pattern processing at less than 1.0 $\mu$m. In order to solve this problem, a plasma source introduced into a magnetic field was developed, and as one example of a device containing this plasma source, a magnetron plasma etching device using a dipole ring magnet (hereinafter referred to as DRM) is well known (Japanese patent laid-open No. Hei 6-37054, FIG. 24 and FIG. 25), However, with a magnetron plasma etching device using the above described DRM generation of low pressure high density plasma is possible, but it is very difficult to control plasma generated on the base with high precision. That is, by introducing a horizontal magnetic field onto the base, it is to be expected that making the plasma density uniform and making the self bias potential uniform on the base will be difficult. At the present time, a scheme for causing the magnetic field to have a slope (Japanese Patent Laid-open No. Sho. 62-21062) and causing the magnetic field introduced into a processing space to be rotated (Japanese Patent Laid-open No, 61-208223) have been adopted as methods of making the plasma density and self bias potential uniform. However, in the method of Japanese Patent Laid-open No. Sho. 62-21062, there was the problem that when the process pressure etc. varied, the optimal magnetic slope also varied. On the other hand, in the method of Japanese Patent Laid-open No, 61-208223, it was anticipated from outward appearances that plasma density would be made uniform for a base in a processing space, but a mechanism for causing rotation of the magnetic field was essential, and it was difficult to miniaturize the device.

The object of the present invention is to provide a plasma etching device capable of etching with respect to a base uniformly, and without charge up damage (generated as a result of potential deviation), independently of pressure and without causing rotation of magnetic field applying means, by making the density of plasma generated on a surface of the base uniform, and making a self bias potential uniform.

DISCLOSURE OF THE INVENTION

A first plasma etching device of the present invention is provided with two parallel plate type electrodes electrode I and electrode II, and means for applying high frequency power connected to the electrode I and electrode II, with a base to be subject to etching processing using plasma being mounted on a surface of the electrode I opposite to the electrode II, and further provided with means for applying a magnetic field being horizontal with respect to the surface of the base to be subjected to plasma etching, and being unidirectional. The plasma etching device further comprises an auxiliary electrode at least on an upstream side, with respect to the base, of a flow of electrons generated by the magnetic field applying means, and the auxiliary electrode includes a local electrode arranged on the side facing the electrode II and means for adjusting impedance provided at a part of the local electrode to be electrically connected with the electrode I.

A second plasma etching device of the present invention is provided with two parallel plate type electrodes electrode I and electrode II, and means for applying high frequency power connected to the electrode I and electrode II, with a base to be subject to etching processing using plasma being mounted on a surface of the electrode I opposite to the electrode II, and further provided with means for applying a magnetic field being horizontal with respect to the surface of the base to be subjected to plasma etching, and being unidirectional. The electrode II comprising a central portion electrically connected to ground, and an outer portion connected to a high frequency power supply capable of being controlled independently of a high frequency power supply connected to the electrode I.

A third plasma etching device of the present invention is provided with two parallel plate type electrodes electrode I and electrode II, and means for applying high frequency power connected to the electrode I and electrode II, with a base to be subject to etching processing using plasma being mounted on a surface of the electrode I opposite to the electrode II, and further provided with means for applying a magnetic field being horizontal with respect to the surface of the base to be subjected to plasma etching, and being unidirectional. The plasma etching device further comprises an auxiliary electrode at least on an upstream side, with respect to the base, of a flow of electrons generated by the magnetic field applying means, with the auxiliary electrode including a local electrode arranged on the side facing the electrode II and means for adjusting impedance provided at a part of the local electrode to be electrically connected with the electrode I, and the electrode II comprising a central portion electrically connected to ground, and an outer portion connected to a high frequency power supply capable of being controlled independently of a high frequency power supply connected to the electrode I.

A fourth plasma etching device of the present invention is provided with two parallel plate type electrodes electrode I and electrode II, and means for applying high frequency power connected to the electrode I and electrode II, with a base to be subject to etching processing using plasma being mounted on a surface of the electrode I opposite to the electrode II, and further provided with means for applying a magnetic field being horizontal with respect to the surface of the base to be subjected to plasma etching, and being unidirectional. An auxiliary electrode of a ring body is provided at a peripheral section of the base. The auxiliary electrode includes a local electrode arranged on the side facing the electrode II and means for adjusting impedance provided at a part of the local electrode to be electrically connected with the electrode I, and the impedance of the ring body at a section corresponding to an upstream side in an electron flow generated by the magnetic field applying means is lower than at other sections.

A fifth plasma etching device of the present invention is provided with two parallel plate type electrodes electrode I and electrode II, and means for applying high frequency power connected to the electrode I and electrode II, with a base to be subject to etching processing using plasma being mounted on a surface of the electrode I opposite to the electrode II, the electrode II comprising a central portion electrically connected to ground, and an ring body outer portion connected to a high frequency power supply capable of being controlled independently of a high frequency power supply connected to the electrode I, the impedance of the ring body at a section corresponding to an upstream side in an electron flow generated by the magnetic field applying means being lower than at other sections.

However, the impedance of the plasma etching device of the first, third and fourth inventions described above refers to the junction impedance between the auxiliary electrode and the electrode I.

DESCRIPTION OF THE NUMERALS

Figure 1:
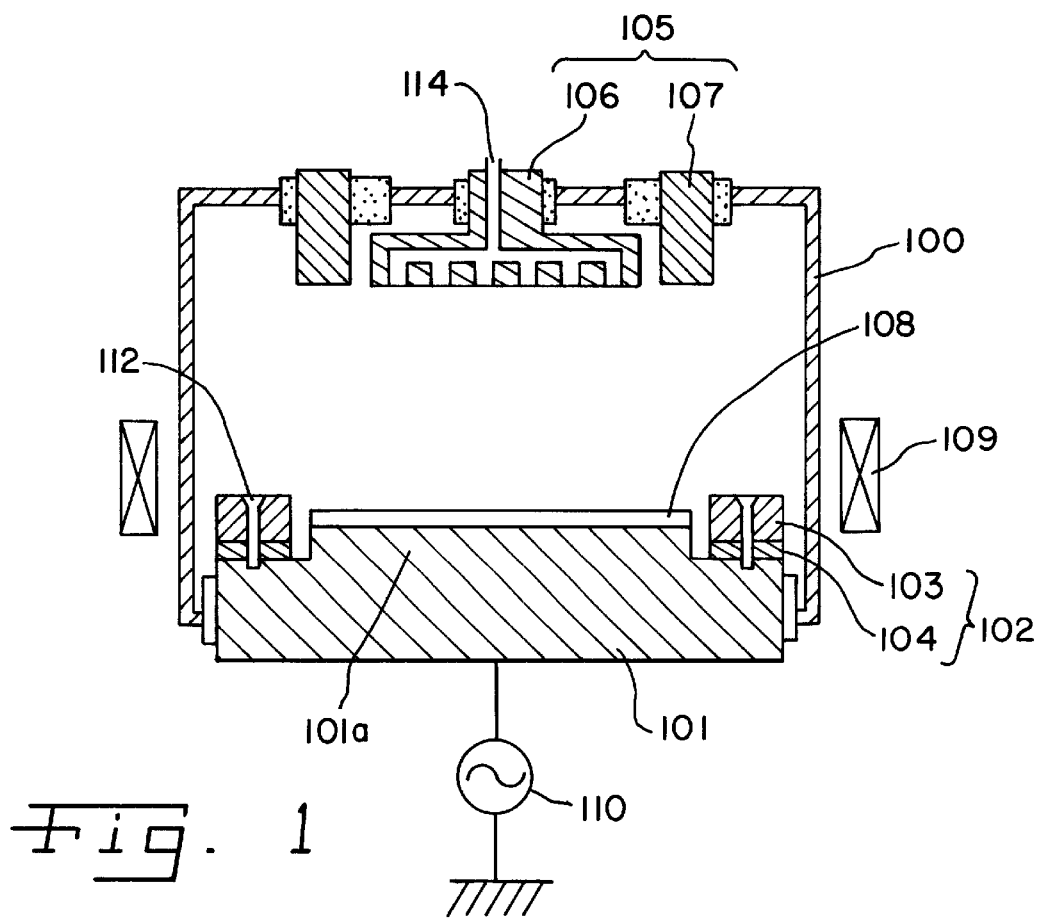
FIG. 1 is a schematic drawing showing one example of a plasma etching device provided with an auxiliary electrode to which the present invention relates.

100 chamber, 101 electrode I, 101*a* section holding base of electrode I (susceptor), 102 auxiliary electrode, 102*n* N pole side local electrode, 102s S pole side local electrode, 102e local electrode provided on an upstream side of at least a flow of electrons, namely E pole side local electrode, 102w W pole side local electrode, 103 local electrode, 104 means for adjusting junction impedance, 105 electrode II, 106 central portion constituting electrode II (inner electrode), 107 outer portion constituting electrode II (outer electrode), 108 base, 109 magnetic field applying means, 110 high frequency power source, 111 screw holes for joining auxiliary electrode, 112 screw for joining auxiliary electrode, 113 probe, 114 shower jacket, 116 single layer film or multiple layer film formed of a material having a different conductivity to the local electrode and the electrode I, 117a cavity provided at an inner part of the local electrode 103, 117b cavity provided close to a boundary of the local electrode 103 and electrode I101, 118 thin film formed of insulating material provided between the local electrode 103 and electrode I101, 119 capacitor provided between the local electrode 103 and electrode I101, 509 DRM (dipole ring magnet), 515 magnetic field, 2401 vacuum container, 2402 first electrode, 2403 wafer, 2404 gas introduction inlet, 2405 high frequency power source, 2406 discharge port, 2407 second electrode, 2411 insulating material, 2412 gate valve, 2413 dipole ring, 2414 matching circuit, 2416 protecting ring, 2417 cooling pipe, 2423 auxiliary magnet, 2450 quartz window, 2451 optical sensor, 2452 monitor, 2532 wafer center, 2533 wafer edge Best Mode for Carrying Out the Invention FIG. 1 is a schematic drawing showing one example of a plasma etching device provided with an auxiliary electrode to which the present invention relates.

In FIG. 1, reference numeral 100 is a chamber, 101 is an electrode I, 101a is a section (susceptor) of the electrode I on which a base is mounted, 102 is an auxiliary electrode, 103 is a local electrode, 104 is junction impedance adjusting means, 105 is an electrode II, 106 is a central section electrically grounded, 107 is an outer section connected to a high frequency power source, not shown, 108 is a base, 109 is magnetic field applying means, 110 is a high frequency power source, 112 is a screw for joining the auxiliary electrode, 114 is a mechanism for introducing process gas comprised of a shower head built into the electrode II.

Figure 2:
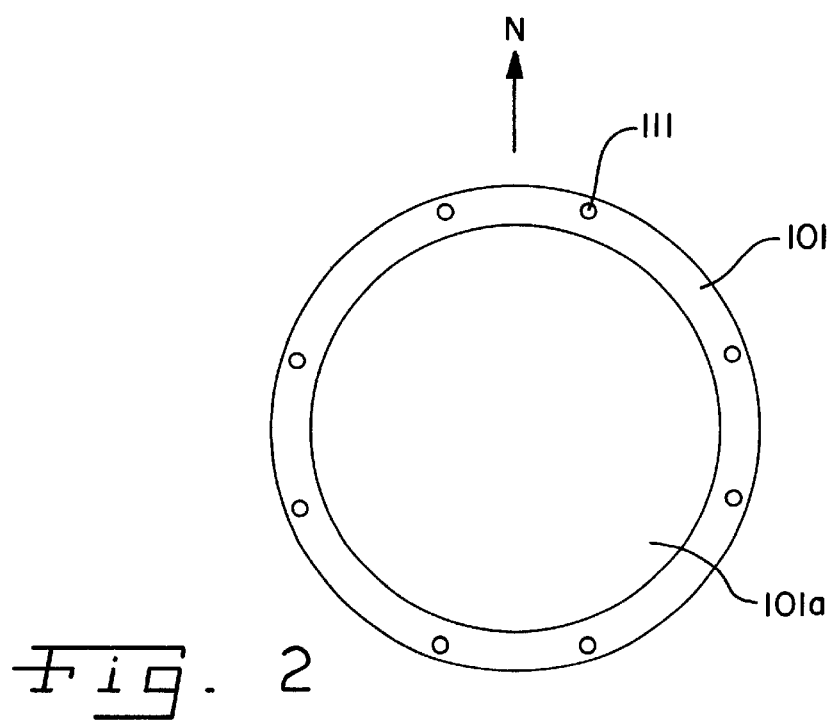
FIG. 2 is a plan view of electrode I looking from the side of electrode II in FIG. 1.
Figure 3:
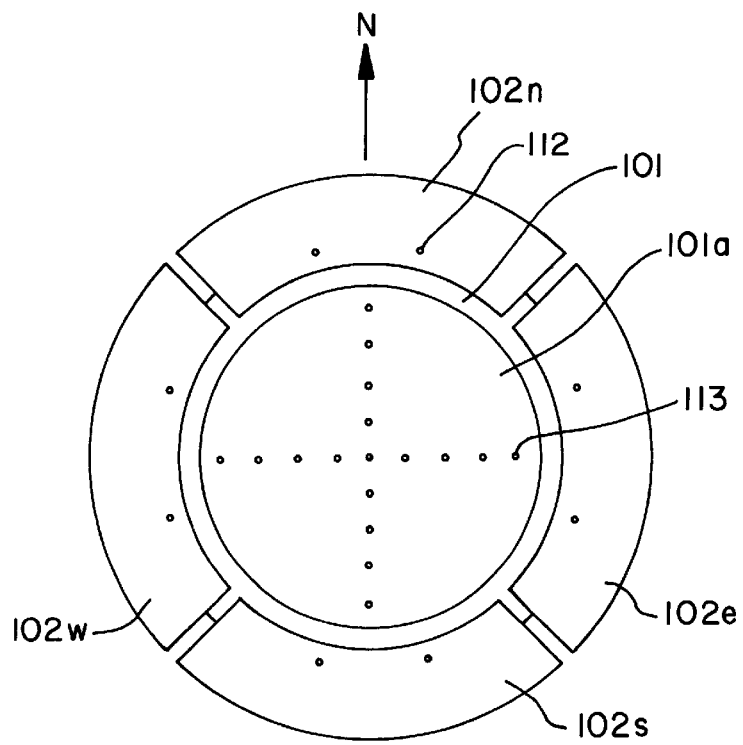
FIG. 3 is a plan view showing the state where the auxiliary electrode is provided over electrode I in FIG. 2.
Figure 4:
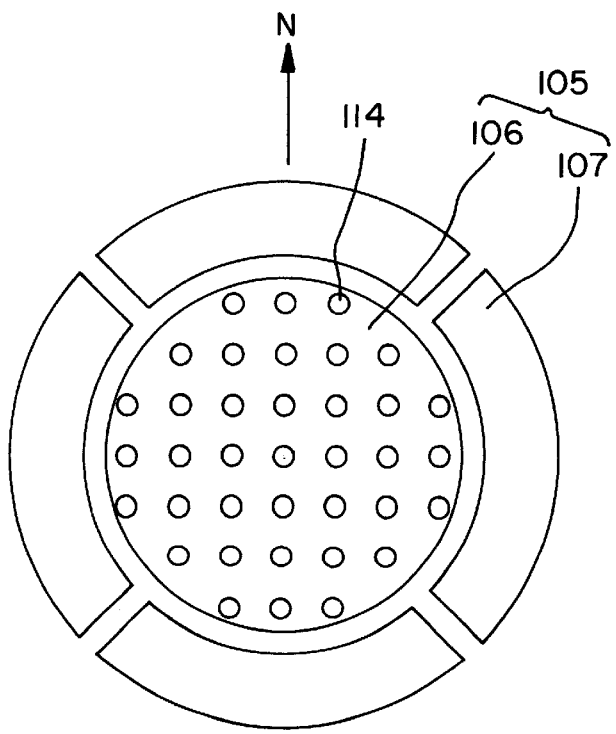
FIG. 4 is a plan view of electrode II looking from the side of electrode I in FIG. 1.
Figure 5:
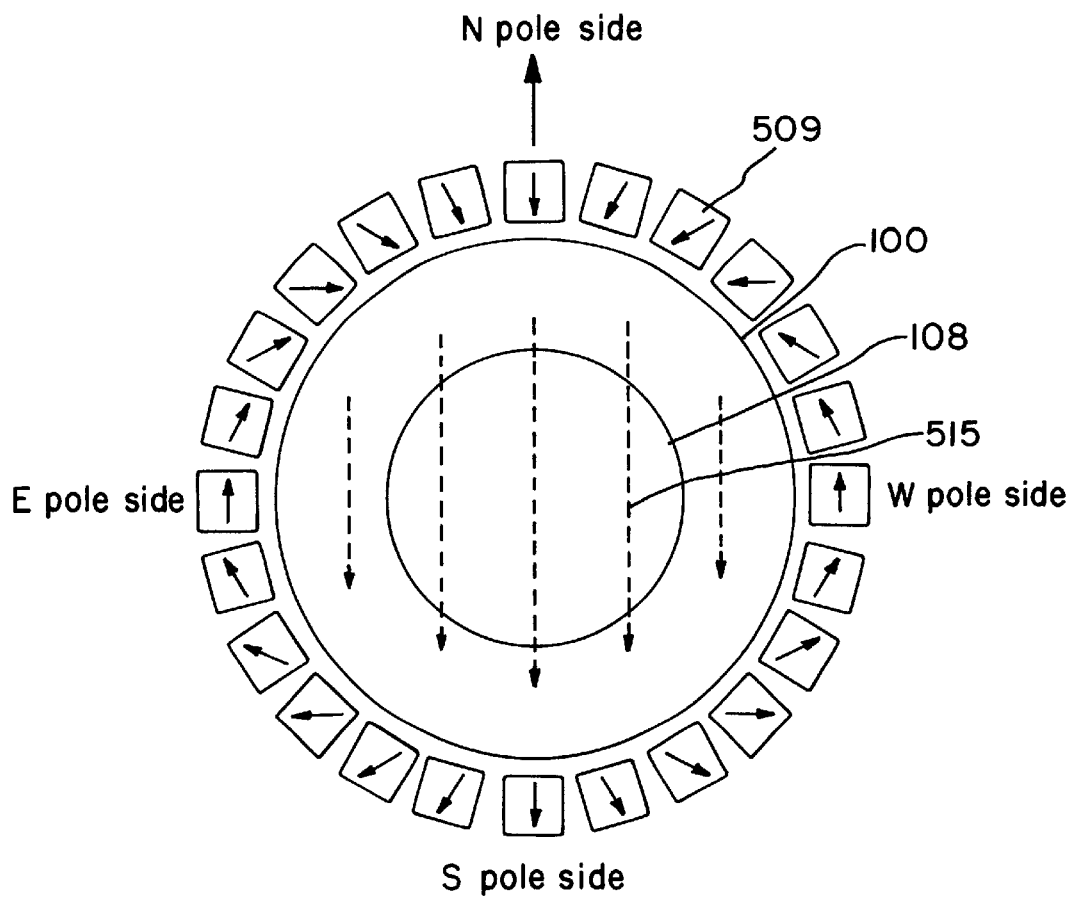
FIG. 5 is a plan view showing magnetic field applying means in FIG. 1.

FIG. 2 is a plan view of the electrode I looking from the electrode II side in FIG. 1. FIG. 3 is a plan view showing the state where the auxiliary electrode is provided over the vicinity of the outer edge of electrode I in FIG. 2. FIG. 4 is a plan view of electrode II looking from the side of electrode I in FIG. 1. FIG. 5 is a plan view showing magnetic field applying means in FIG. 1.

The auxiliary electrode 102 to which the present invention relates is mounted for use in a plasma etching apparatus which is provided with two horizontal plate type electrodes I 101 and II 105, as shown in FIG. 1, and provided with means 109 for applying a directional magnetic field horizontally relative to a surface of the base 108 that is to be subjected to plasma etching. A base 108 that is to be subjected to processing such as etching etc. using plasma is mounted on a surface of the electrode I 101 opposite to the electrode II 105.

FIG. 5 is a plan view showing the base 108 and a DRM (dipole ring magnet) 509 functioning as magnetic field applying means 109, looking from the side of electrode II. With the plasma etching device of FIG. 1, as the magnetic field applying means 109, a DRM (dipole ring magnet) is used as means for applying a magnetic field 515 having directionality horizontally relative to the surface of the base 1808 that is to be subjected to plasma etching, as shown in FIG. 5.

The auxiliary electrode 102 shown in FIG. 1 is provided at least on an upstream side of at least an electron flow generated by the magnetic field applying means, relative to the base, as shown in FIG. 2 and FIG. 3. The auxiliary electrode 102 comprises a local electrode 103 arranged at an opposite side to the electrode II 105, and impedance adjusting means provided at a section of the local electrode electrically connected to the electrode I. However, FIG. 2 and FIG. 3 show one example where impedance adjusting means (not shown) have been provided between the local electrode 103 and the electrode I 101, so as to overlap below the local electrode 103.

FIG. 27 is a schematic plan view looking from the electrode II side, and shows a relative positional relationship between local electrode 103 constituting the auxiliary electrode 102 shown in FIG. 1 and the base 108. In FIG. 27, an example is shown in which the impedance adjusting means (not shown) is provided between the local electrode 103 and the electrode I 101 so as to overlap below the local electrode 103, but it is also possible to employ other methods of provision, such as that shown in FIG. 26.

In the following, the relative positional relationship between the local electrode 103 to which the present invention relates and the base 108 will be described in detail using FIG. 27.

Figure 27A:
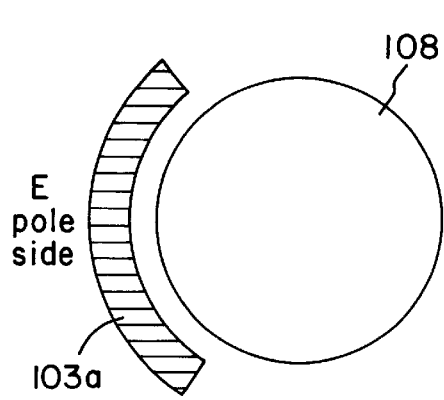
FIG. 27 is a schematic plan view of electrode I and electrode II looking from the electrode II side, and shows a relative positional relationship between local electrode 103 constituting the auxiliary electrode 102 shown in FIG. 1 and the base 108.

FIG. 27(a) shows the case where a local electrode constituting an auxiliary electrode is a first local electrode 103a made of a conductive material provided only on an upstream side (E pole side) of an electron flow caused by the magnetic field applying means.

Figure 27B:
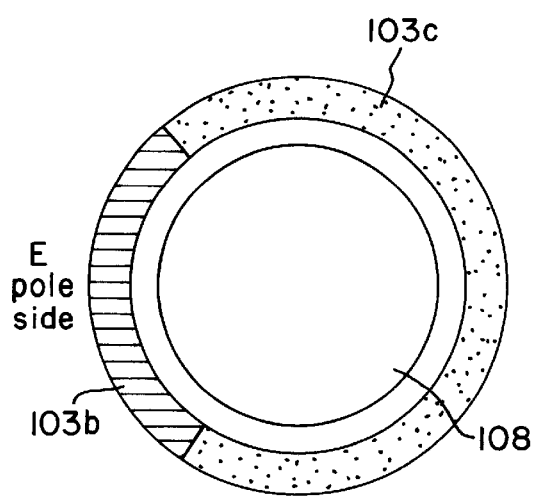

FIG. 27(b) shows the case where a local electrode constituting an auxiliary electrode is a combination of a second local electrode 103b made of a conductive material provided at least on an upstream side (E pole side) of an electron flow caused by the magnetic field applying means, and a third local electrode 103c made of an insulating material provided exe an upstream side.

Figure 27C:
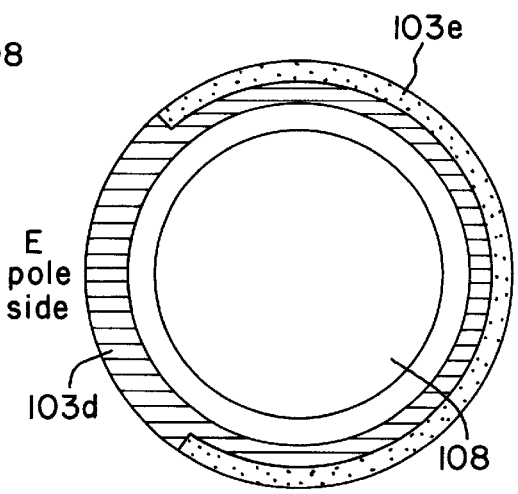

FIG. 27(c) shows the case where a local electrode constituting an auxiliary electrode is a combination of a fourth local electrode 103d made of a conductive material that is wide at least at an upstream side of an electron flow caused by the magnetic field applying means and narrow except the upstream side, and a fifth local electrode 103e made of an insulating material provided outside a region where the fourth electrode is narrow, looking from the base side.

Figure 27D:
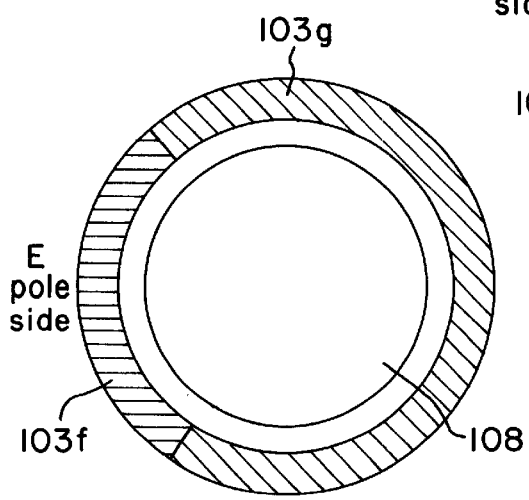

FIG. 27(d) shows the case where a ring body auxiliary electrode is provided at an edge section of the base, and the auxiliary electrode comprises a local electrode arranged at an opposite side to the electrode II and impedance adjusting means provided at a section of the local electrode electrically connected to the electrode I, and where the impedance of the ring body is lower at least at a section (part of local electrode 103f) equivalent to an upstream side of an electron flow generated by the magnetic field applying means than at other sections (part of the local electrode 103g).

Figure 28A:
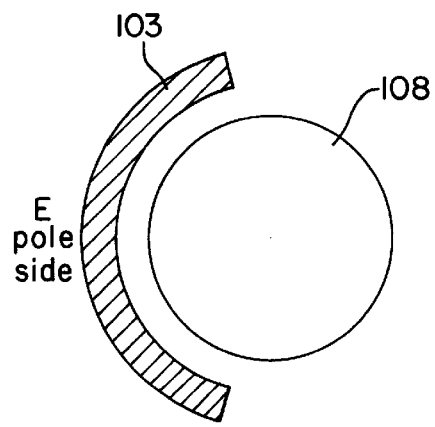
FIG. 28 is a schematic plan view for describing the arrangement of the local electrode and the base, and shows the case where a local electrode constituting the auxiliary electrode provided on an upstream side of at least a flow of electrons caused by magnetic field applying means has a size to cover the upstream side of the electron flow, looking from the position of the whole of the base.
Figure 28B:
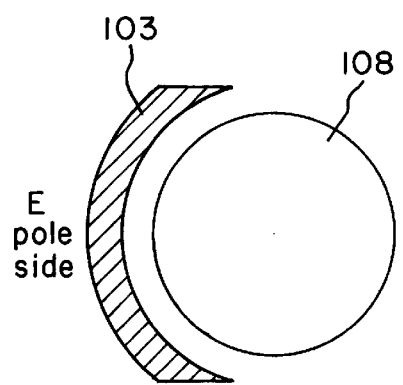
Figure 28C:
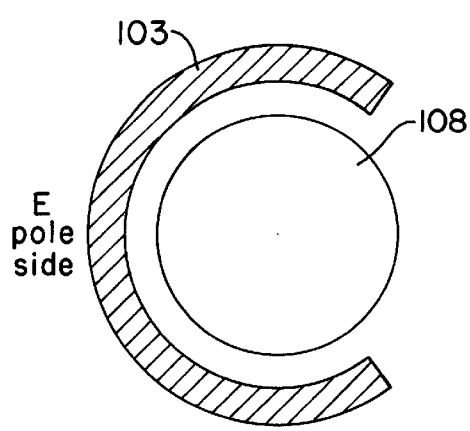
Figure 28D:
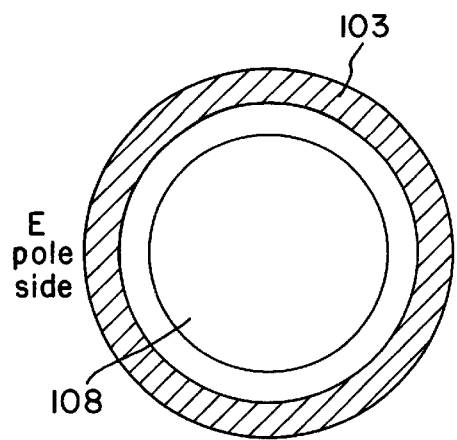

As shown in FIGS. 28(a)–(d), looking from the overall position of the base, the local electrodes constituting the auxiliary electrode preferably have such as size that they cover the upstream side of the electron flow (E pole side in FIG. 28). FIG. 28(a) shows the case where almost a semicircular section of the base is surrounded by the local electrode, FIG. 28(b) shows the case where the base is surrounded by the local electrode up to the same extent as the width of the base, looking from the upstream side of the electron flow, FIG. 28(c) shows the case where more than a semicircular section of the base is surrounded by the local electrode, and FIG. 28(d) shows the case where the base is completely surrounded by the local electrode. By providing such a large electrode, it is possible to cause a uniform parallel flow of electrons in one direction over the entire surface of the base, which means that surface distribution of plasma density for the base becomes uniform and it is possible to carry out uniform etching processing for the base.

The chamber 100 in FIG. 1 functions as a decompression vessel. Al alloy etc. is used at the wall surface material for the chamber 100, but in the case of etching oxide film etc., a material that has been nitride processed (such as AlN) is preferred in consideration of the fact that moisture released from the chamber wall surface etc. is a main reason for increased resist etching rate. This not only applies to the chamber wall surfaces. Material of the electrodes and parts inside of the chamber must also be formed from a material that, as much as is possible, does not release moisture etc. As a conductive material, glassy carbon or SiC can be used, while AlN or SiN etc. can be used as the insulating material. Selection of material is made taking into consideration thermal conductivity, ratios of electric field strength at surfaces, etc.

Electric power for generating plasma is supplied from a high frequency power source 110 to the electrode I 101. The electrode I 101 has a susceptor 101a at a position for holding the base (for example a Si wafer) 108 centrally, and the diameter of the susceptor is wafer size. Also, an auxiliary electrode 102 is mounted at an outside section of the electrode I 101 at a position separated from the base 108. The auxiliary electrode 102 comprises the local electrode 103 provided on at least an upstream side of a flow of electrons caused by the magnetic field applying means 109, and impedance adjusting means 104 provided at a section of the local electrode 103 electrically connected to the electrode I 101.

In the following, a detailed description will be given of each of the members constituting the etching device to which the present invention relates.

(1) Auxiliary Electrode 102

With the auxiliary electrode to which the present invention relates, the size of the junction impedance with the electrode I 101, the size of the local electrode 103, the position at which the local electrode 103 is provided, and the height difference between the local electrode 103 and the base 108 are extremely important. Differences between the related art and the present invention will be described in the following with respect to these points.

(1—1) Size of the Junction Impedance with the Electrode I 101

Even with a conventional etching device, there were cases where a ring body or an electrode which was separate from the electrode I was provided at an outer section of an electrode corresponding to the electrode I 101 of the present invention, namely at a position of the auxiliary electrode 102. However, with an electrode which is separate from the electrode I 101 of the conventional etching device, only the following two uses existed. Firstly, the whole of the electrode was made of a conductive material, there was an electrically conductive path to an electrode corresponding to the electrode I 101 of the present invention, the surface area of the cathode is made wide and plasma uniformity is maintained. Secondly, the whole of the electrode was made of a material that does not pass high frequencies (such as quartz, for example), the circumference of a susceptor on which the base was mounted was insulated, and there was an effective power inputted to the susceptor increased.

On the other hand, the auxiliary electrode 102 to which the present invention relates comprises a local electrode 103 formed of a conductive material similar to the electrode I 101, and impedance adjustment means 104 provided at a section of the local electrode 103 electrically connected to the electrode I 101. By causing the junction impedance for the electrode I 101 with the local electrode 103 to vary, it is possible to control the penetration of high frequencies into the surface of the local electrode (namely a surface where the auxiliary electrode 102 is exposed to plasma), which is significantly different from the related art. For example, the auxiliary electrode 102 of the present invention is provided with a thin film 118 as a capacitor and a capacitor 119 between the local electrode 103 and the electrode I 101, as shown in FIG. 26(e), and this thin film 118 and capacitor 119 can be implemented using a structure comprising the impedance adjusting means 104.

As the local electrode 103 formed of a conductive material, it is preferable to use Al, Si, Cu or stainless steel (hereinafter referred to as SUS) that have not been surface processed, for example, and to carry out either anodic oxide coating, fluoride static body processing or coating with MgO or the like on the surface of the these materials. Also, SiO2 or Teflon can be used as the local electrode 103 formed of an insulating material.

The configuration shown in FIG. 26 can be used as the impedance adjusting means 104. FIG. 26 is a schematic cross sectional view showing various forms of the auxiliary electrode 102 shown in FIG. 1.

Figure 26A:
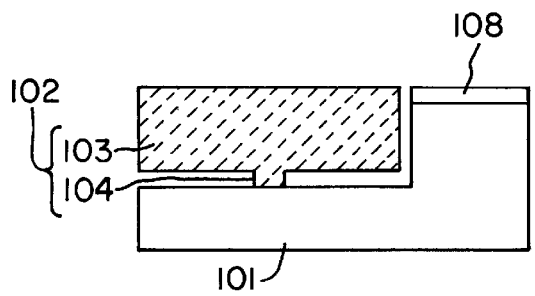
FIG. 26 is a schematic cross sectional view showing various forms of the auxiliary electrode 102 shown in FIG. 1.

FIG. 26(a) shows a case where the local electrode 103 has a region with a narrow surface area for coming into contact with the electrode I 101, and this region constitutes the impedance adjusting means 104. In FIG. 26(a), a specified junction impedance can be obtained by adjusting the surface are of the region in question.

Figure 26B:
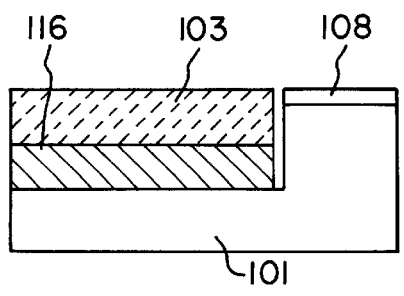
Figure 26C:
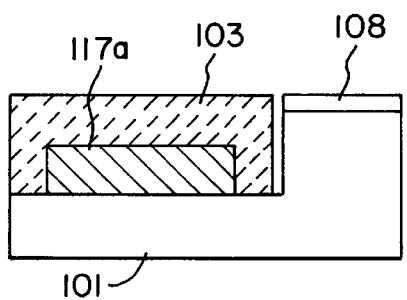
Figure 26D:
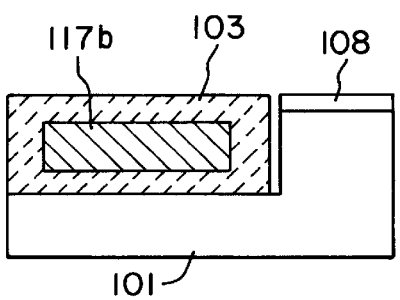
Figure 26E:
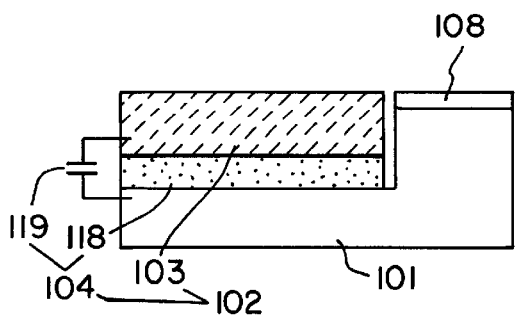
Figure 26F:
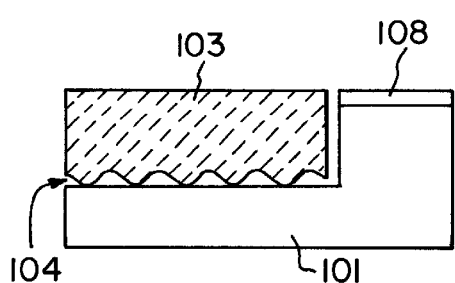
Figure 26G:
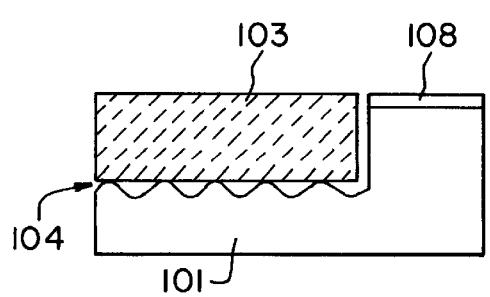
Figure 26H:
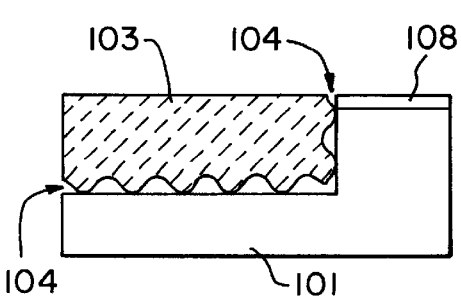
Figure 26I:
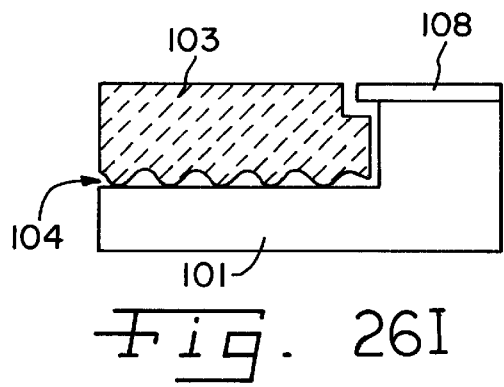

FIG. 26(f) shows a case where the local electrode 103 has an uneven region for coming into contact with the electrode I 101, and this region constitutes the impedance adjusting means 104. FIG. 26(g) shows a case where the electrode I 101 has an uneven region for coming into contact with the local electrode 103, and this region constitutes the impedance adjusting means 104. FIG. 26(h) shows a case where two surfaces of the local electrode 103 have uneven regions for coming into contact with the electrode I 101, and these regions constitute the impedance adjusting means 104. FIG. 26(i) shows a case where, in the structure of FIG. 26(f), the base 108 is arranged on a section 101a (susceptor) of the electrode I for mounting the base so as to protrude in the direction of the local electrode 103. In FIG. 26(f) to FIG. 26(I), a specified junction impedance can be obtained by adjusting the shape of the uneven regions or the surface area where the unevenness is provided. Particularly, in FIG. 26(I) a characteristic where it is difficult to carry out etching of a side surface of the section 101a (susceptor) of the electrode I where the base is mounted opposite to the local electrode 103 can be held together.

FIG. 26(b) shows the case where there is a single layer film or a multilayer film 116 formed of a material having a specific conductivity different from the local electrode and the electrode I between the local electrode 103 and the electrode I 101, and this film 116 constitutes the impedance adjusting means 104. In FIG. 26(b), a specified junction impedance can be obtained by adjusting the dielectric constant and film thickness of a single layer film, or adjusting the dielectric constant, film thickness, or deposition sequence of each of the films constituting a multilayer film.

FIG. 26(c) shows the case where a cavity 117a is provided inside the local electrode 103, and this cavity 117a constitutes the impedance adjusting means 104. FIG. 26(d) shows the case where a cavity 117b is provided in the vicinity of a boundary between the local electrode 103 and the electrode I 101, and this cavity 117b constitutes the impedance adjusting means 104. In FIG. 26(c) and FIG. 26(d), a specified junction impedance can be obtained by adjusting the size of the cavity 117. A function of adjusting the impedance between the local electrode 103 and the electrode I 101 is also achieved if the inside of the cavity 117 is either of a vacuum, a body of inert gas, or a material having a different dielectric constant from the local electrode and the electrode I.

FIG. 26(e) shows the case where a capacitor 119 and a thin film 118 are provided between the local electrode 103 and the electrode I 101 as a capacitor, and the capacitor 119 and thin film 118 constitute the impedance adjusting means 104. In FIG. 26(e), a specified junction impedance can be obtained by adjusting the capacitance of the capacitor 119. Also, in FIG. 26(e), as another example, it is possible to form the whole of the auxiliary electrode 102 from an insulating material (such as Teflon, SiO2, etc.), and to insert a connection terminal comprised of a capacitor into the auxiliary electrode. By utilizing this junction impedance adjusting means 104, it is possible to provide a specified capacitance between the electrode I 101 and the auxiliary electrode 102. Also, with this method, it is possible to suitably modify the junction impedance.

As a material for the local electrode 103, it is preferable to use one of Al, Cu, Si, SiC, or glassy carbon.

(1–2) Size of the local electrode 103

The width of the local electrode 103 (in the case where the local electrode 103 and the impedance adjusting means 104 have the same width, this means the width of the auxiliary electrode 102) can be made as small as 20 mm in the device of the present invention, compared to a device of the related art in which it must be about 30–40 mm order to achieve the desired functions. Accordingly, in the present invention it is possible to make the diameter of the local electrode 103 as small as 40 mm.

Figure 23:
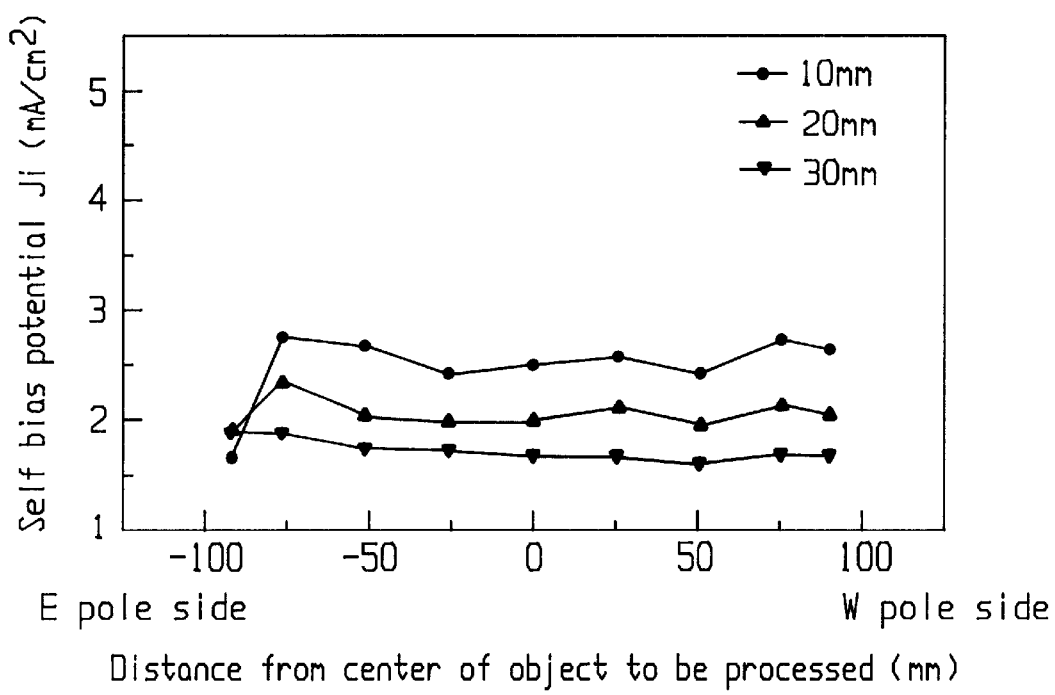
FIG. 23 is a graph showing results of Vdc observed in the case where high frequency is only applied to an E pole side outer electrode (107e) of the electrode II.
Figure 24:
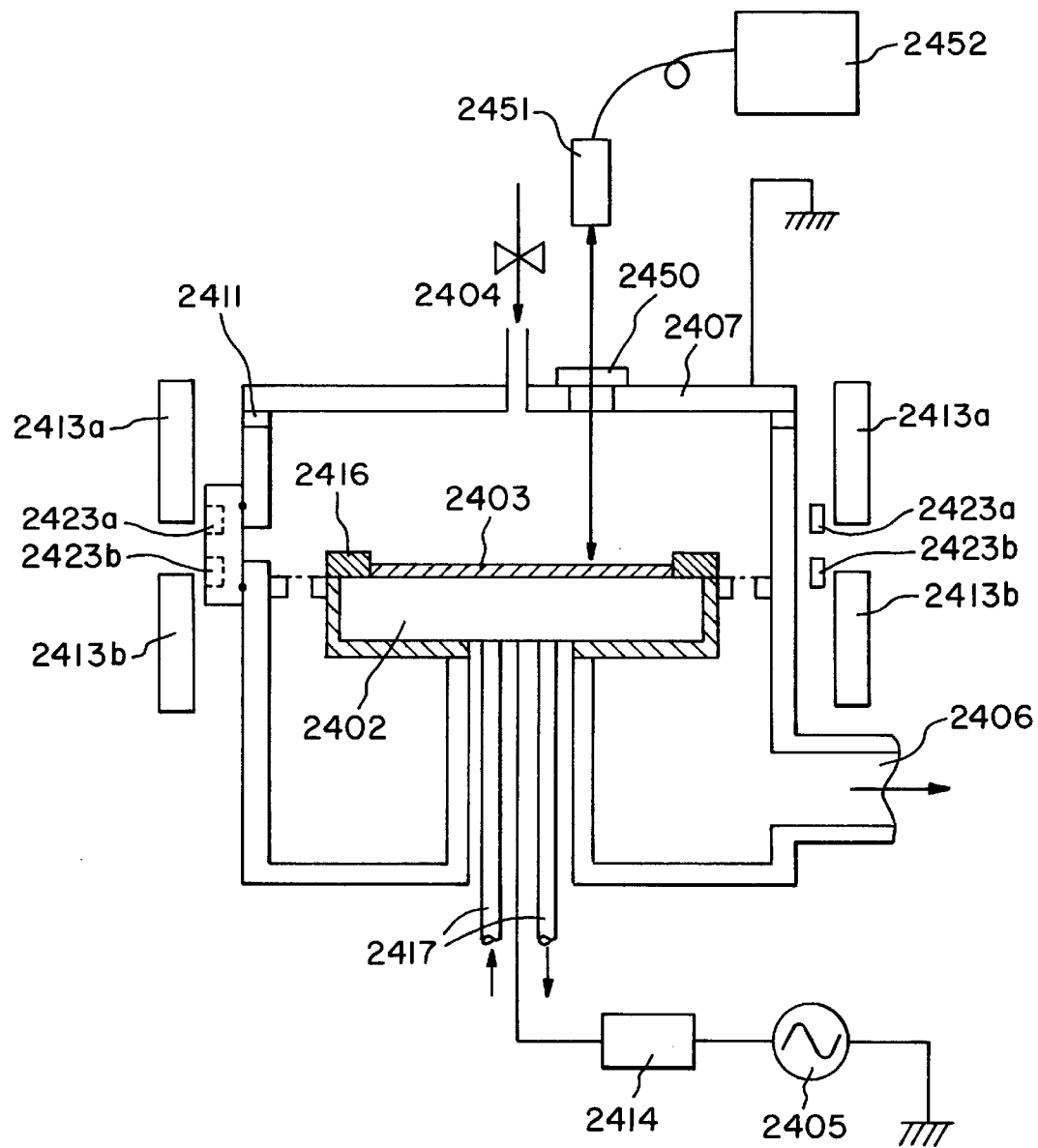
FIG. 24 is a schematic diagram showing a magnetron plasma etching device using a conventional dipole ring magnet (DRM).
Figure 25A:
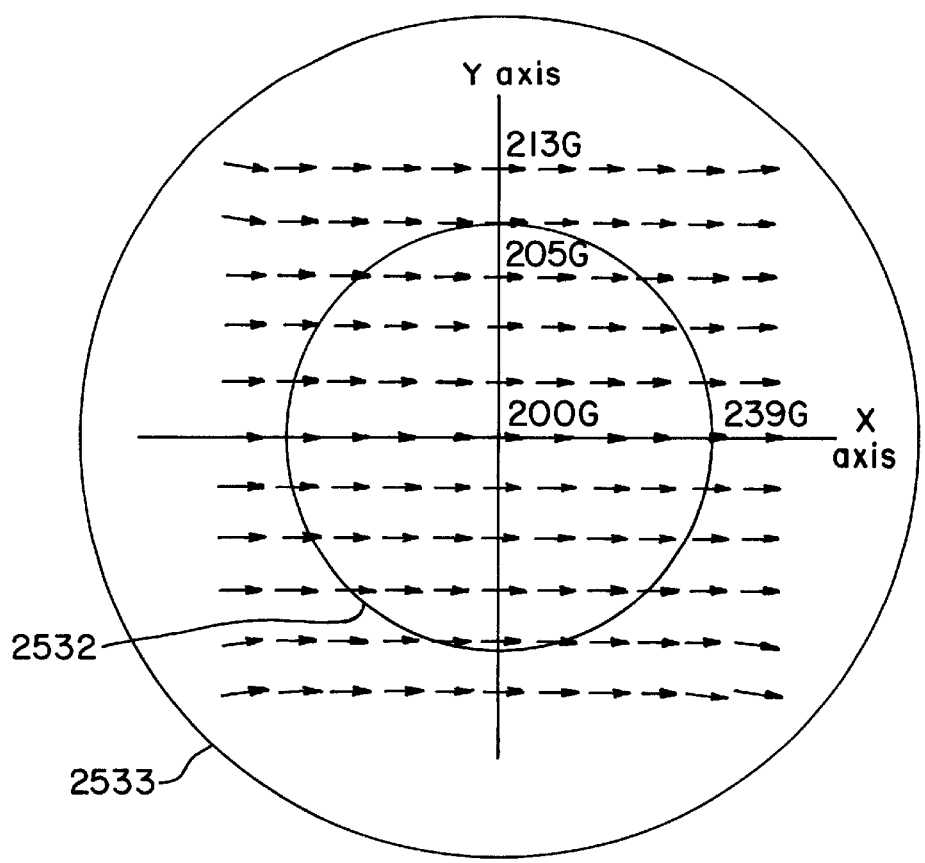
FIG. 25 is a schematic diagram showing magnetic field distribution formed by the dipole ring magnet in the device of FIG. 24.
Figure 25B:
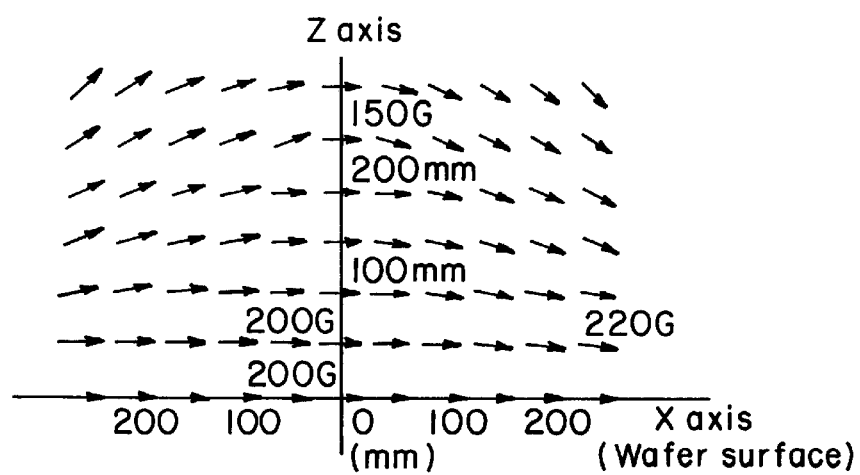

Also, in FIG. 1, the size of the base 108 formed of a wafer is 200 mm, but the required size of the local electrode to which the present invention relates does not change significantly even if the size of the base 108 becomes 300 mm, as long as processing conditions are constant. Accordingly, it is possible to make the internal diameter of the chamber small at that part, and it will be possible to handle progressively increased diameter bases in the future without making the chamber size extremely large. FIG. 23 shows a relationship between width of the local electrode 103 and base in-plane distribution of plasma density. From FIG. 23, it is understood that with a pressure of, for example, 20 mTorr, if the width of the local electrode 103 is 20 mm a drop in plasma density at the E pole side can be made small.

(1–3) Position at which the local electrode 103 is provided

In the plasma etching device of FIG. 1, as shown in FIG. 5, a DRM (dipole ring magnet) capable of applying a magnetic field 515, being horizontal with respect to a surface of the base 508 that is to be subjected to plasma etching and which is unidirectional, is used as the means for applying a magnetic field 109. With this type of DRM, since the electrons moves around lines of magnetic force inside of plasma sheath on the base, it is possible to generate highly dense plasma. In this case, since the E pole side in FIG. 5 is upstream of the electron flow, it is extremely important that the auxiliary electrode 102 exists at the E pole side, for the following reasons.

First of all, the thing to note is the way in which electrons move. Electrons move in a spiral movement (cycloid movement) while winding around lines of magnetic force, and at that time the turning radius of the electrons can be expressed by the following equation.

$$\text{Rama radius (mm)}: R = \frac{33.7 \cdot (Vdc)^{1/2}}{B}$$

Rama radius (mm): $R = 33.7 \cdot (Vdc)^{1/2}$

Vdc is self bias potential, and B is magnetic flux density. From this equation, it will be understood that if Vdc=200V and magnetic flux density=200 G, R will be approximately 2 mm. Accordingly, electrons rotate around in a space as close as possible to the cathode without dispersing and this is fitted into an ion sheath. If electrons fly out from the ion sheath, the electric field(self bias) disappears and the cycloid movement does not arise.

Figure 6A:
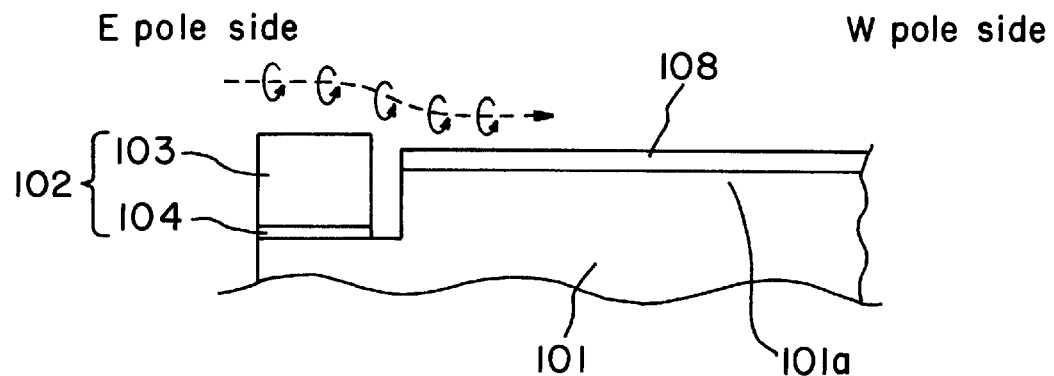
FIG. 6 is a schematic cross sectional view showing a positional relationship between electrode I, the auxiliary electrode and a base.
Figure 6B:
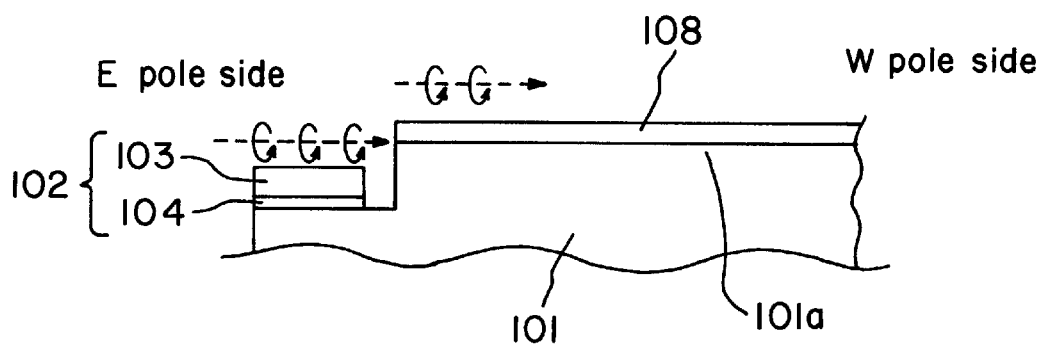

FIG. 6 is a schematic cross sectional drawing showing a positional relationship between the electrode I 101, the auxiliary electrode 102 and the base 108. The auxiliary electrode 102 of FIG. 6 illustrates the case where the local electrode 103 and the impedance adjusting means 104 have the same width. Sections that are not shown in this drawing basically correspond to sections in FIG. 1. As will be understood from FIG. 6, in order to stably realize the above described electron movement, it is important to provide the auxiliary electrode 102e having an suitable junction impedance with the electrode I at the E pole side which is upstream of the electron flow. By locating the auxiliary electrode 102e, smooth electron flow (namely continuous movement in the direction shown by the dotted lines and arrows in FIG. 6) is made possible even at an outer region of the base 108 at the auxiliary electrode 102e side. As a result, it is possible to make the etching rate at the outer region of the base 108 at the auxiliary electrode 102e side the same as that at the center of the base. In this case, it is also possible to finely adjust the impedance using a variable capacitor.

In FIG. 3, the reason why the auxiliary electrode 102 has been divided into 4 is for an experiment which will be described later, it is perfectly acceptable for it to be a single integral electrode.

In the etching device using the DRM of the related art, since it is intended to make the etching rate for the base uniform, the magnetic field to be applied is sometimes rotated. However, if it is possible to process the base in a state where the magnetic field is not rotated, by positioning the auxiliary electrode 102 on an upstream side of the electron flow, the input power efficiency is further raised and it is made possible to increase the density of generated plasma. FIG. 3 is a plan view showing the arrangement of the auxiliary electrode 102 looking from the electrode II side. With respect to the local electrode except the E pole side of the external magnetic field, since distribution of plasma density on the base has no relation to the presence or absence of the local electrode, there is absolutely no problem in applying high frequency to the E pole side and having other sections in a totally insulated state. Accordingly, when the base is processed without rotating the magnets, it is possible to use a local electrode having a shape where only the E pole side is isolated. Also, it goes without saying that the divided shape of the local electrode is not limited to this example. In short, it is essential to have a shape that makes it possible to compensate for density decrease at an upstream side of the electron flow. Base processing without rotating the magnetic field is made possible with plasma uniformity for the first time using the present invention.

As a result, since the auxiliary electrode 102 of the invention of the present application has the above described structure, it is possible to obtain a plasma etching device in which there is no lowering of the density of generated plasma and it is possible to expect uniform plasma density.

(1–4) Difference in height between surface of local electrode 103 constituting auxiliary electrode 102 to be exposed to plasma, and surface of base 108

In the following, the case where there is a difference between the height of the surface of the local electrode 103 and the height of the surface of the base 108 will be discussed. In the case where the surface of the local electrode is higher than the surface of the base (FIG. 6(a)) within the width of the ion sheath, movement of electrons generated at the surface of the local electrode reaches the surface of the base, but conversely, in the case where the surface of the local electrode is lower than the surface of the base (FIG. 6(b)), with only a 0.5 mm difference in height, movement of electrodes is interrupted at the boundary of the local electrode and the base. Specifically, movement of electrons starts correctly at the edge surface of the susceptor, and the local electrode becomes pointless. Here, electrons collide with the susceptor causing movement to be temporarily stopped.

Accordingly, it is preferable to set the surface of the local electrode exposed to plasma the same height as the surface of the base, or higher than the surface of the base by up to the width of the ion sheath (only slightly high (0.1–1 mm)). Particularly, a local electrode that has been set in the latter state does not become lower than the base, even when being sputtered, which means that there is the advantage that the performance can be maintained over a long period of time.

Also, by making a distance between the local electrode and a part of the electrode I on which the base is mounted (susceptor) 101a longer than a distance that will be electrically short circuit, and shorter than a distance where movement of electrons generated on the local electrode no longer reach the base, flow of electrons generated on the local electrode can be made smooth from the local electrode to the base.

In the present invention, a case where plasma density on a substrate within a uniform horizontal magnetic field is made uniform is given as an example of the effect of using the above described auxiliary electrode 102, but test results have also been obtained where self bias voltage on the base is non-uniform, even if the plasma in the vicinity of the base is uniform. This can be considered to be a problem caused due to a phenomenon where electrons move from the E pole to the W pole because of the horizontal magnetic field of the DRM, but as will be described later this problem is capable of being solved by applying high frequency to an outer section 107 of the electrode II in a state where a central section of the electrode II is at a ground potential.

(2) Electrode II 105

FIG. 4 is a plan view of electrode II looking from the side of electrode I in FIG. 1. The electrode II 105 to which the present invention relates has a central section 106 electrically grounded and an outer section 107 connected to a high frequency power source, not shown in the drawings, and is positioned opposite to the electrode I 101. The characteristic of the electrode II to which the present invention relates is that an electrode formed in an integral shape in the related art is concentrically divided, and a high frequency power source that is separated from the high frequency power source to be applied to the electrode I can be input to an outer electrode.

Particularly, in the case where the concentrically divided electrode II is used, by making a distance between the central portion and outer portion constituting the electrode II longer than a distance that will be electrically short circuit, it is possible to generate and maintain stable plasma.

Also, by making a distance between the electrode I or the outer portion of the electrode II, as well as a distance between the electrode II and the electrode I and the local electrode, a distance at which a divided ratio, of a minimum value and maximum value of localized plasma density generated in a space sandwiched between electrode I and electrode II, becomes at least 0.1 it is possible to obtain stable plasma.

Further, it is possible to ensure high uniformity of self bias potential on the base by positioning an outer terminal of the base mounted on electrode I within a range from an outer edge to an inner edge of the outer section constituting the electrode II.

Figure 7A:
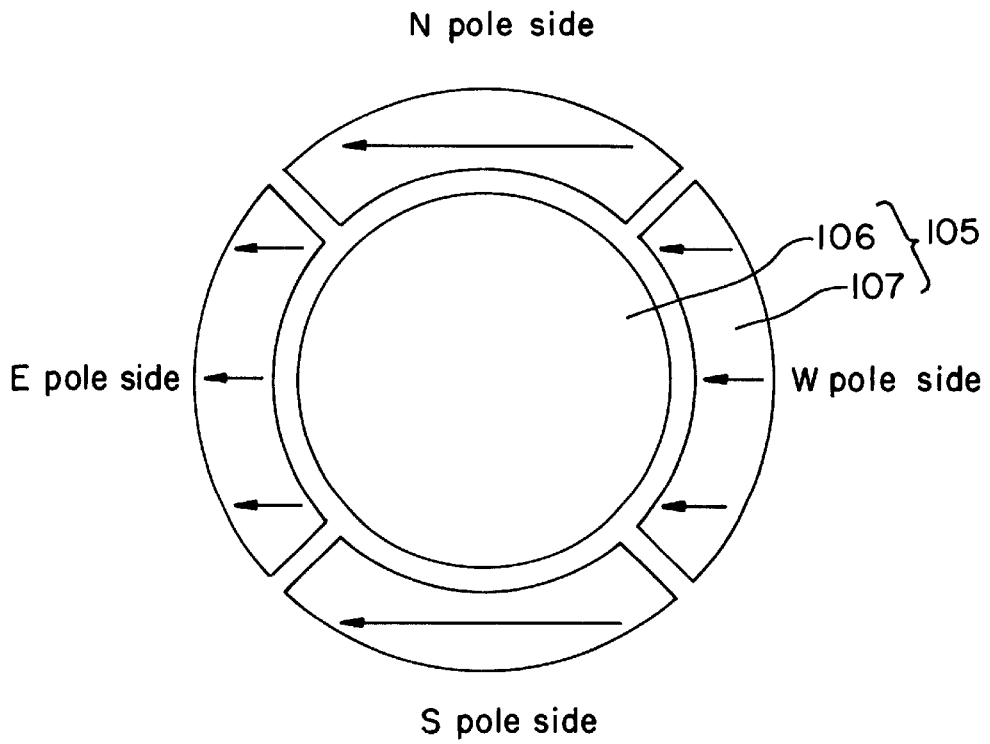
FIG. 7 is a model diagram of electron flow to which the present invention relates, and shows the case where high frequency is only applied to an electrode outside the structure of electrode II.
Figure 7B:
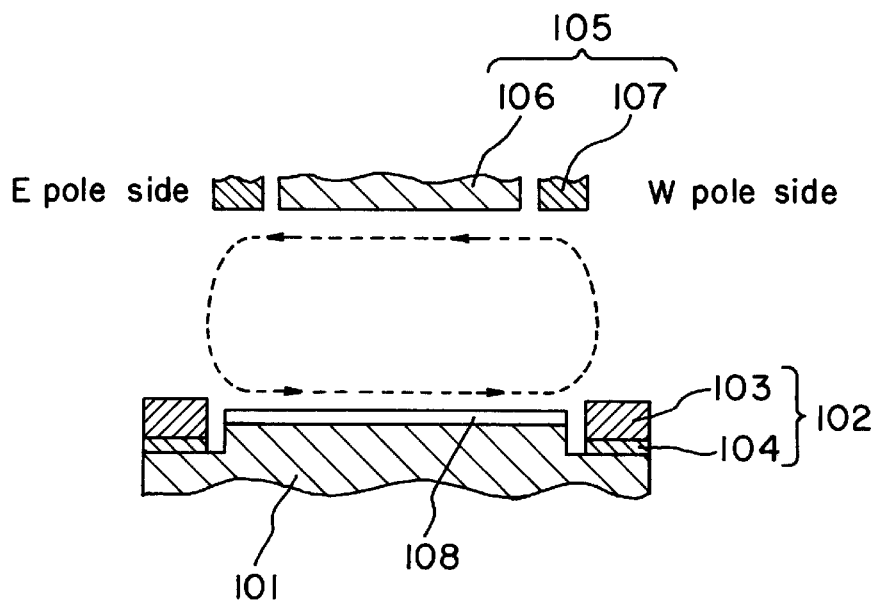
Figure 36A:
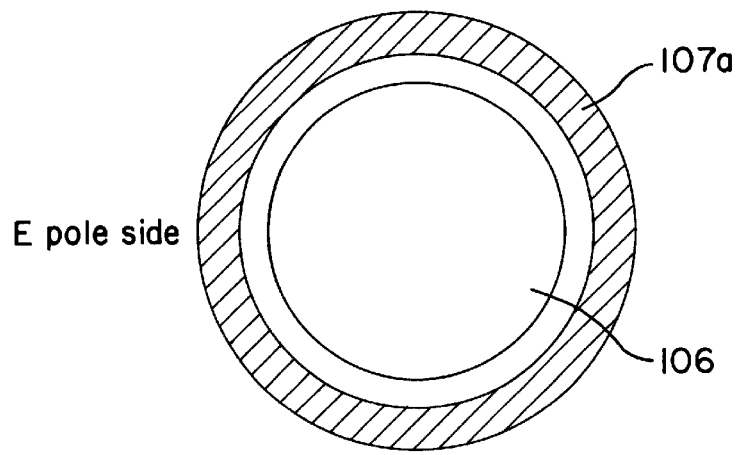
FIG. 36 is a schematic plan view of electrode II looking from the electrode I side, and is used to describe various forms of the outer section 107 constituting electrode II.

In FIG. 4 and FIG. 7, dividing of the outer section 107 constituting the electrode II 105 into 4 parts has been done for the sake of tests that will be described later, but it can also be a single body. That is, as shown in FIG. 36(a), the outer section 107 constituting the electrode II 105 can be an integral body 107a having the same impedance.

Figure 36B:
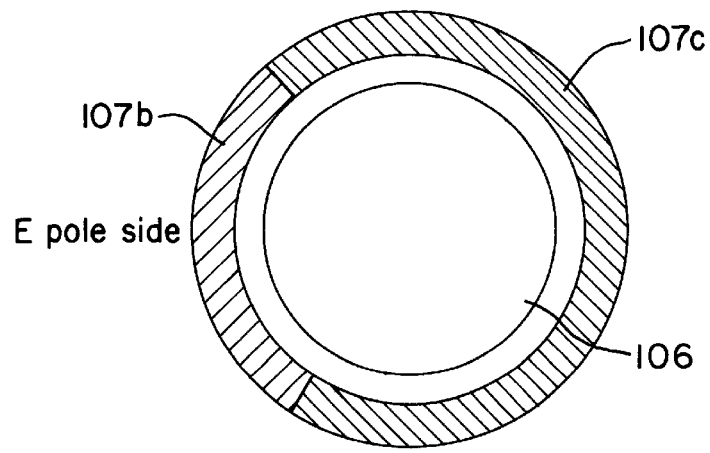

Still further, as shown in FIG. 36(b), the outer section 107 constituting the electrode II 105 is a ring body, and can be provided with region of differing impedance so that the impedance of the ring body at a section 107b corresponding to an upstream side (E pole side) of an electron flow generated by application of a magnetic field is lower than at another region 107c.

As has been described above, the auxiliary electrode 102 (namely the local electrode 103) to which the present invention relates is effective in bringing about uniform plasma density on the base within a uniform horizontal magnetic field, but there is a problem that self bias voltage for the base is not uniform, even if plasma is uniform in the vicinity of the base.

However, with the electrode II 105 of the present invention, the inner side electrode 106 shown in FIG. 4 is at a ground potential and high frequency is applied to the outer side electrode 107, and by making the high frequency to be applied a higher frequency than that of electrode I it is possible to solve the problem where the self bias potential (Vdc) for the base is not uniform even if plasma in the vicinity of the base is uniform.

Figure 8A:
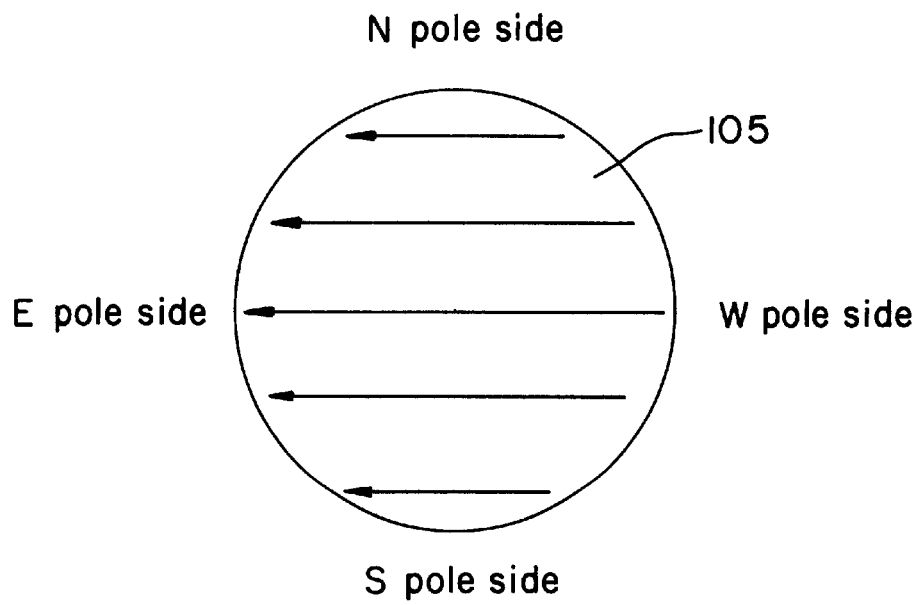
FIG. 8 is a model diagram of electron flow of the related art, and shows the case where high frequency is only applied to both an electrode inside and an electrode outside the structure of electrode II.
Figure 8B:
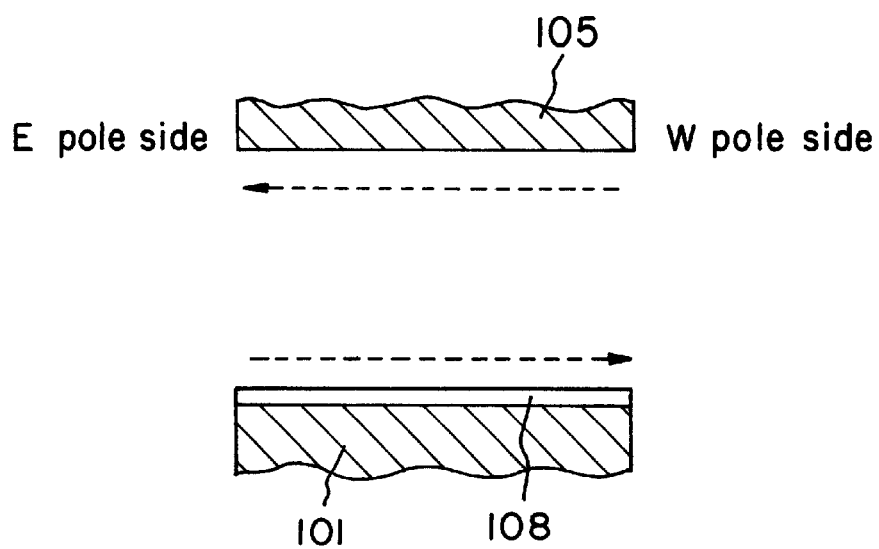

Description will now be given not of applying high frequency to both the inner side electrode 106 and the outer side electrode 107, but to only the outer side electrode 107. FIG. 7 and FIG. 8 are model diagrams of electron flow at the time of plasma generating with the respective systems. FIG. 7 shows the case of the present invention where high frequency is only applied to the outer side electrode 107, and FIG. 8 shows the case of the related art where high frequency is applied to bother the inner side electrode and the outer electrode.

With the conventional method of FIG. 8, the electron flow direction is in an opposite direction of movement to electrode I 101 over the whole of electrode II 105. However, in the method of the present invention shown in FIG. 7

(application of high frequency to outer section only), there is flow opposite to electrode I 101 at the outer section 107 of electrode II, but once they get to the E side edge, electrons join the electrode I side flow and can be considered to move once more to the W side. In this way, the electron flow for the surface of electrode II and the electron flow for the surface of electrode I form a single closed system, and this is one important feature of the present invention.

By using the system of the present invention of FIG. 7, with plasma using a substantially uniform horizontal magnetic field of 120 gauss, variations (max-min) of self bias potential Vdc that are normally the range 20–30V in the technique of the related art can be made as small as a few volts in the present invention. This means that it is possible to almost completely eradicate wafer charge up damage that constitutes a problem at the time of etching. This was solved in the related art by causing the magnetic field to maintain a slope, and it is significant that the present invention can solve the problem with a uniform horizontal magnetic field.

In other words, in the device of the related art, determining of a gradient condition for the sloping magnetic field was carried out by calculating an optimum magnetic field for a single process and forming the magnetic field. Since the optimum value varied according to process conditions (pressure, source material type, RF power etc.), costs were increased significantly and there was the disadvantage that it lacked general purpose applicability. On the other hand, in the etching device of the present invention, with the horizontal magnetic field there is no dependence on the processing conditions as described above and it is possible to design a stable etching process.

Here, the diameter of the inner side electrode 106 and the outer diameter of the outer side electrode 107 when the size of the base to be processed is 200 mm are respectively 160 mm and 260 mm, but naturally the effects of the present invention are still obtained if various modifications are made to the diameter of the inner side electrode 106 etc.

Also, with the present invention high frequency input to the electrode I 101 is 13.56 MHz, while the high frequency input to the outer section 107 of the electrode II is 100 MHz, but high frequency input to the outer section 107 of the electrode II can be any frequency as long as it is higher than that of the electrode I 101.

Further, in the present invention, since the high frequency power applied to the outer section 107 of the electrode II is set to a high frequency compared to the frequency of electrode I (mainly, 13.56 or 27.12 MHz are used, but naturally the present invention is not limited to these two frequencies), it is possible to obtain the effects with a comparatively low power compared to the power of electrode I. That is, if 13.56 MHz at 400 W is applied to electrode I, the applied power of 100 MHz to the outer section 107 of electrode II for achieving Vdc correction effects will effectively be 75–100 W. This power is variously altered depending on plasma conditions, but it can be said that the power that needs to be applied to the outer section 107 of the electrode II is about 0.25 times the electrode I power.

(3) Structure for introducing process gas

A shower head 114 as shown in FIG. 4 is used as a structure for introducing process gas into the chamber 100. The shower head 114 has process gas introduction pipes numerously arranged in a central section 106 of the electrode II 105 that is electrically grounded, and by injecting process gas from an outer section of the plasma device 100 so that there is in-plane uniformity for the base 108 mounted on the electrode I it is possible to maintain uniformity of gas flow in the vicinity of the base and a ratio of reaction by-product and source material gas. This shower head serves a very important function in the etching of an oxide film.

(4) Measures for supplying power from the two electrodes electrode I and electrode II (two cycle excitation method)

Figure 9:
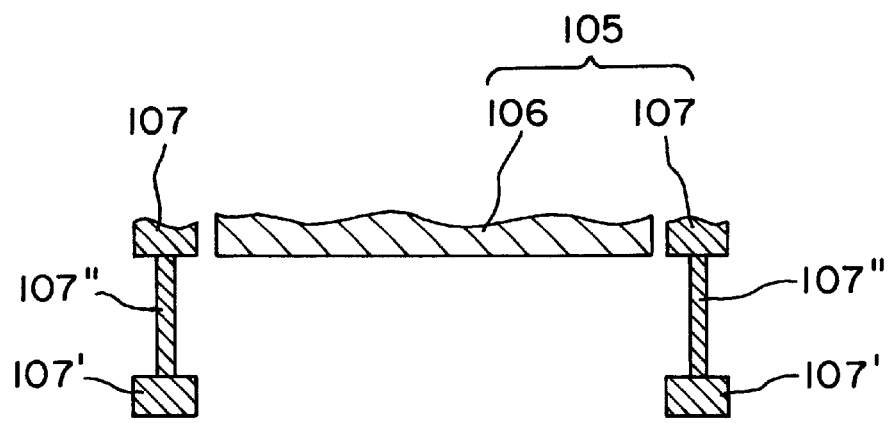
FIG. 9 is a schematic cross sectional view showing the case where only an electrode outside the structure of the electrode II of FIG. 4 is provided close to electrode I.
Figure 9:
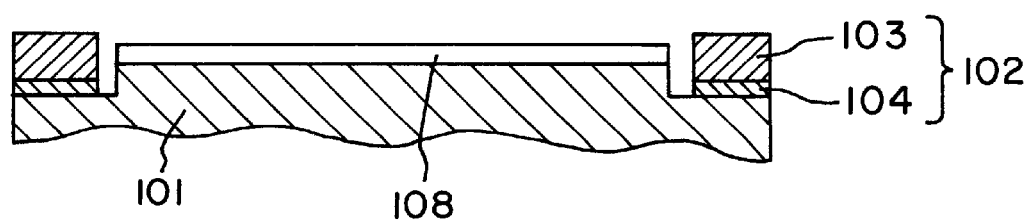

In the 2 cycle excitation method, the distance between the electrode I and the electrode II is very important. In the present invention, this distance is set to 10–20 mm, and under these conditions the effect of power application to the electrode II of the present invention (outer section of electrode II) is strikingly noticeable. However, in the event of large diameter bases of greater than 300 mm in the future, flow of process gas will progressively increase, high speed discharge of gas will become essential, and it would appear necessary to make the distance between the electrodes greater than 30 mm. In this case, the structure of the inner side electrode 106 and the outer side electrode 107 in FIG. 4 is changed as shown in FIG. 9, and by providing members 107' and 107" so as to form a structure where only the outer side electrode 107 is accessible to the electrode I 101, the required speed of discharging gas is achieved, while it becomes possible to carry out plasma correction.

By providing the above described plasma etching device having the two electrodes electrode I and electrode II, it becomes possible to generate uniform plasma at a level at which it is possible to carry out processing using a uniform horizontal magnetic field and without rotating the magnetic field, and it is also possible to reduce the overall size of the device, lower the cost and make it general purpose. Making the auxiliary electrode smaller also has the same effects on reducing the size of the device.

Embodiments

The present invention will be described in the following, with reference to the drawings. Description will be given of an auxiliary electrode and a plasma etching device, but the present invention is not limited to these embodiments.

Embodiment 1

In this embodiment, a parallel plate type plasma etching device provided with the auxiliary electrode shown in FIG. 1 is used, the plasma density distribution of plasma generated when a high frequency (13.56 [MHz]) is applied to electrode I is investigated with different methods of installing the auxiliary electrode.

The auxiliary electrode 102 is used being divided into four parts, each part having a direction axis of one of four poles (N pole, S pole E pole and W pole) generated by the magnetic field applying means 109 as a center. The effects of the auxiliary electrode of the present invention were then investigated with one auxiliary electrode (for example, 102e) independently made a cathode (i.e. electrically short circuited to the electrode I 101) and with the remaining three auxiliary electrodes (for example, 102w, 102n and 102s) in a floating state.

The auxiliary electrode 102 comprises a local electrode 103 formed of a conductive material (Al), and junction impedance adjusting means 104. As the junction impedance adjusting means 104, a copper spacer is used in the case where the local electrode 103 and the electrode I 101 are to be shorted, and a Teflon spacer is used in the case where the local electrode 103 and the electrode I 101 are to be insulated. The local electrode 103 is formed so as to be connected to the electrode I 101 via this spacer using a screw 112.

The inside of the chamber 100 has such a structure that it can be decompressed, and has been decompressed to a level of an ultimate vacuum $10^{-5}$ Pa by a turbo molecular pump, not shown in the drawings. Source material gas for causing generation of plasma is introduced between two electrodes from a shower head provided at a central section of the electrode II. In the present invention, argon gas is used as the source material gas, and ion current density: Jion [mA/cm$^2$] and self bias potential: Vdc [volt] were evaluated. Since ion current density can be considered to be the plasma density, it will be referred to as plasma density from now on. Evaluation of gas pressure was carried out with gas flow amount in the range 10–200 mTorr.

The electrode II 105 is constructed as shown in FIG. 4. Specifically, differing from the single plate structure in the device of the related art, in the device of this embodiment the electrode 106 of the central portion and four electrodes 107 of the outer portion are separated. In this embodiment, in order to evaluate the auxiliary electrode the electrode II is completely grounded, as in the device of the related art.

As shown in FIG. 3, probes 113 for observing plasma were embedded in the electrode I 101 formed of a conductive material (SUS), at seventeen points within the plane of a 200 mmφ electrode (a diameter equivalent to a base of 8 inchφ). Vdc was obtained by measuring the floating potential within the plasma for each of the embedded probes 113, and plasma density (Jion) was obtained based on a current value which was measured when probes were biased more negative than the already obtained Vdc.

Figure 10:
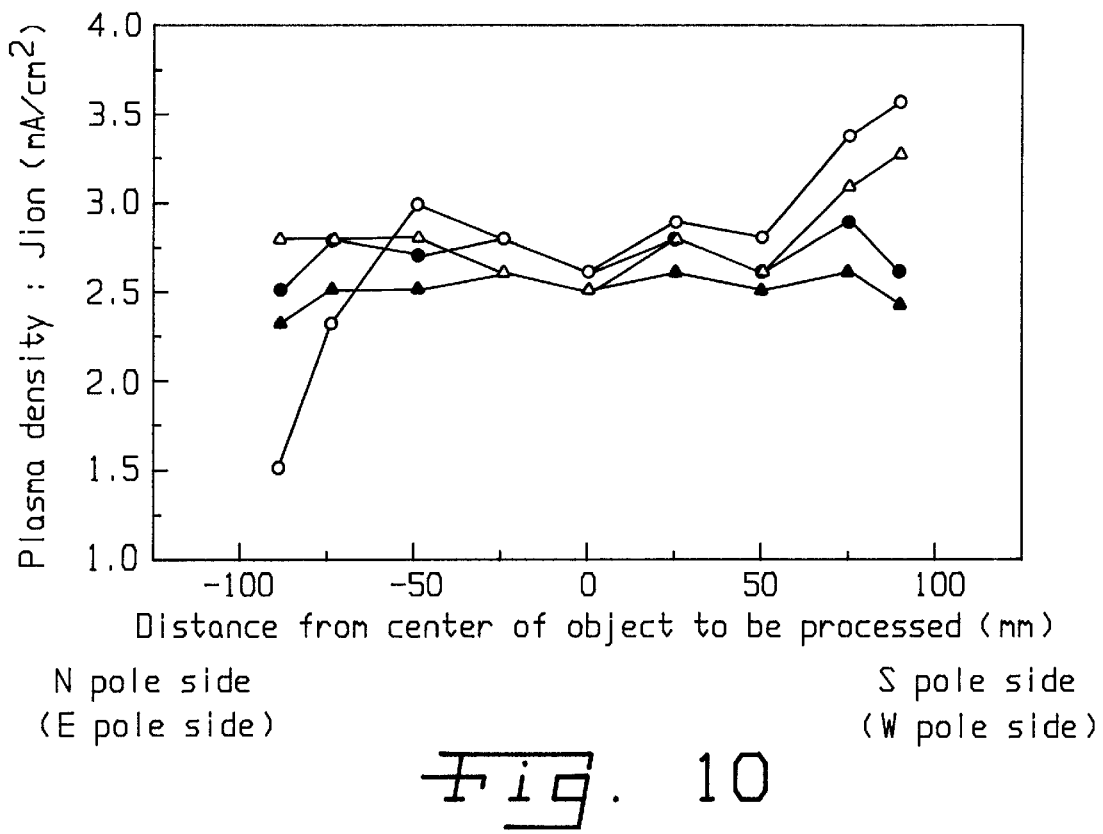
FIG. 10 is a graph showing plasma density observed in the case where only an east pole side local electrode (103e) is made a cathode.
Figure 11:
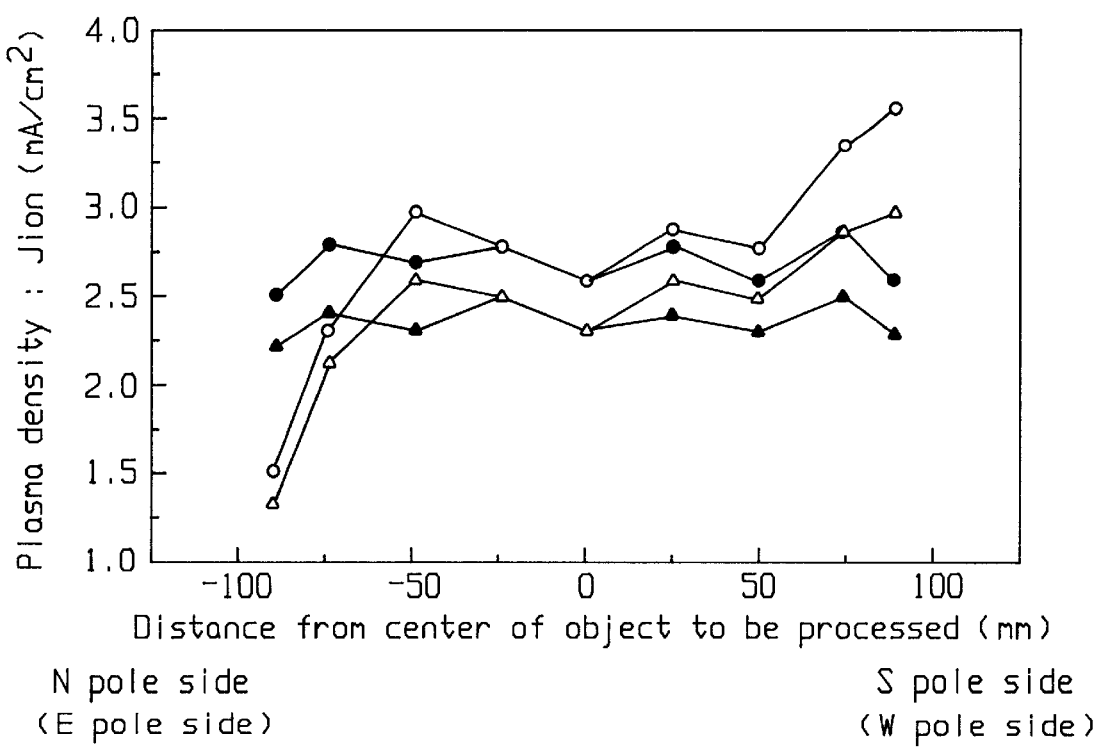
FIG. 11 is a graph showing plasma density observed in the case where only a west pole side local electrode (103w) is made a cathode.
Figure 12:
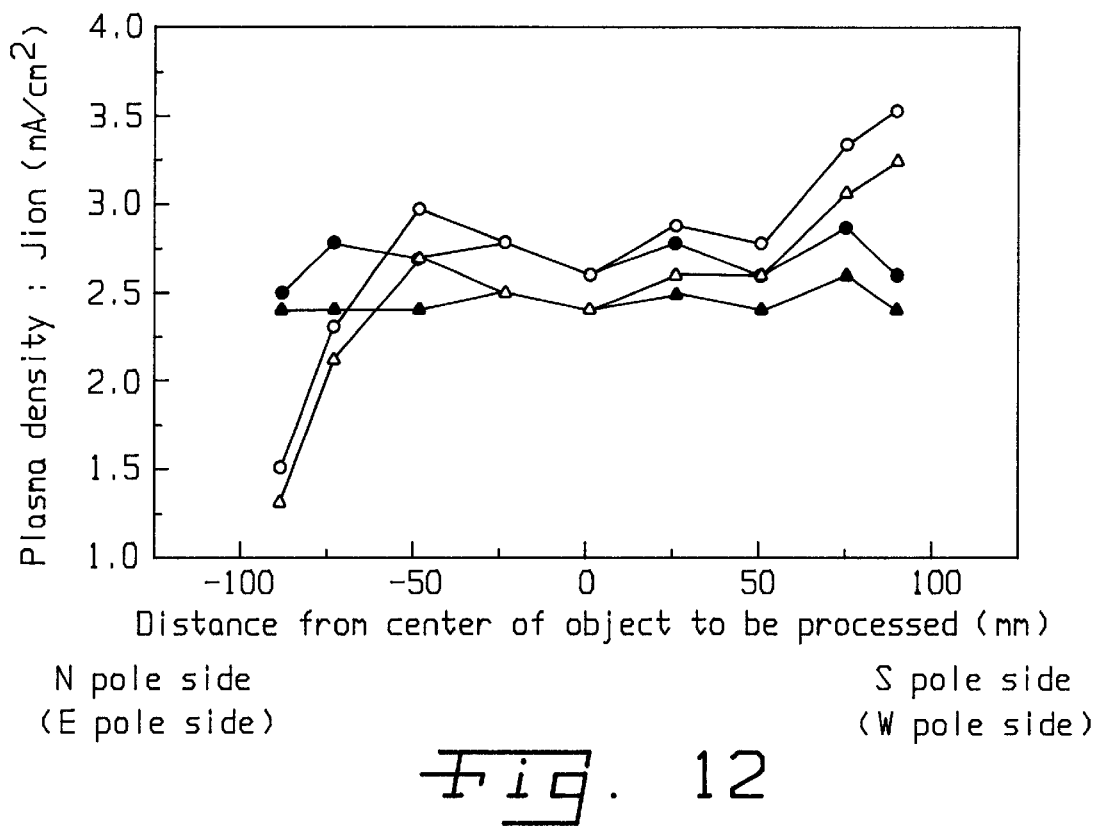
FIG. 12 is a graph showing plasma density observed in the case where only a north pole side local electrode (103n) is made a cathode.
Figure 13:
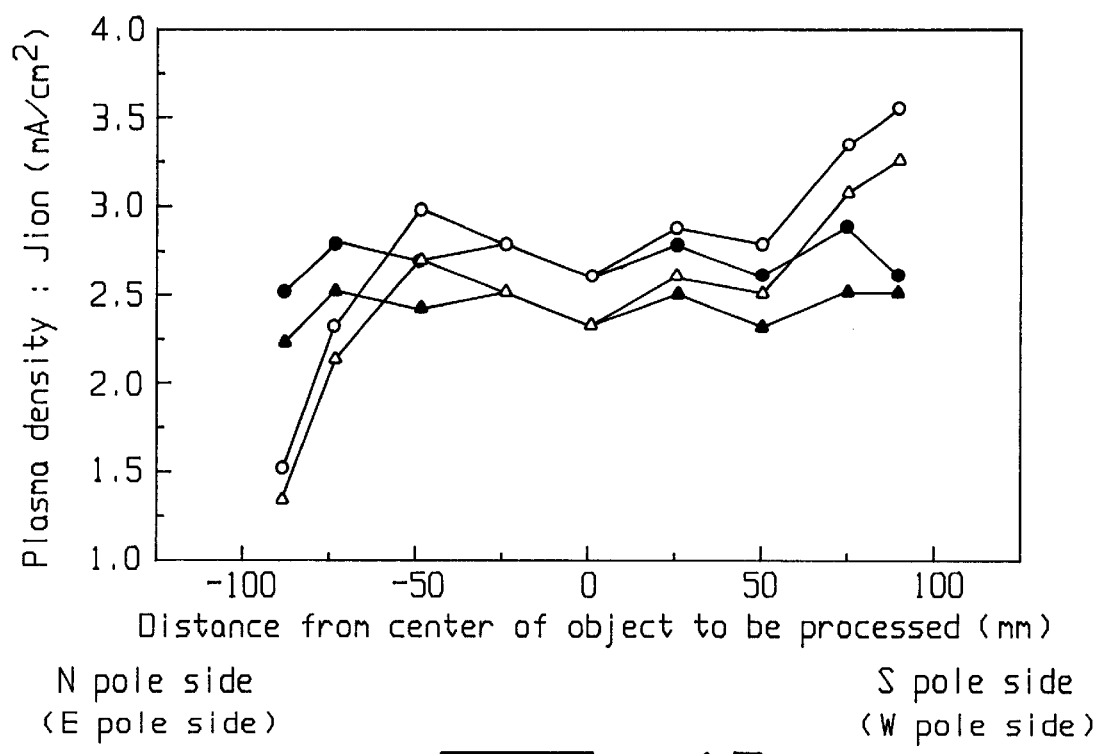
FIG. 13 is a graph showing plasma density observed in the case where only a south pole side local electrode (103s) is made a cathode.

FIG. 10–FIG. 13 are results of evaluating plasma density: Jion [mA/cm$^2$]. FIG. 10 shows the case where only an E pole side local electrode (103e) is made a cathode, FIG. 11 shows the case where only a W pole side local electrode (103w) is made a cathode, FIG. 12 shows the case where only an N pole side local electrode (103n) is made a cathode, and FIG. 13 shows the case where only an S pole side local electrode (103s) is made a cathode. Here, making a local electrode a cathode means putting the local electrode of a specified pole side into a lower impedance state than the local electrodes of the other pole sides. In FIG. 10–FIG. 13, the horizontal axis is distance from the center of the base, while the vertical axis is plasma density (Jion).

Also, the meaning of each of the symbols used in FIG. 10–FIG. 13 is shown in Table 1.

TABLE 1

| Fig. No. | Local electrode that has been made cathode | Symbol | Made cathode? | Direction of measuring plasma density |
|---|---|---|---|---|
| FIG. 10 | Only E pole side (302e) | ▲ | Only E pole side is made cathode | N pole side–S pole side |
| | | △ | Only E pole side is made cathode | E pole side–W pole side |
| | | ● | All local electrodes made non-cathode | N pole side–S pole side |
| | | ○ | All local electrodes made non-cathode | E pole side–W pole side |
| FIG. 11 | Only W pole side (302w) | ▲ | Only W pole side is made cathode | N pole side–S pole side |
| | | △ | Only W pole side is made cathode | E pole side–W pole side |
| | | ● | All local electrodes made non-cathode | N pole side–S pole side |
| | | ○ | All local electrodes made non-cathode | E pole side–W pole side |
| FIG. 12 | Only N pole side (302n) | ▲ | Only N pole side is made cathode | N pole side–S pole side |
| | | △ | Only N pole side is made cathode | E pole side–W pole side |
| | | ● | All local electrodes made non-cathode | N pole side–S pole side |
| | | ○ | All local electrodes made non-cathode | E pole side–W pole side |
| FIG. 12 | Only S pole side (302s) | ▲ | Only S pole side is made cathode | N pole side–S pole side |
| | | △ | Only S pole side is made cathode | E pole side–W pole side |
| | | ● | All local electrodes made non-cathode | N pole side–S pole side |
| | | ○ | All local electrodes made non-cathode | E pole side–W pole side |

From these 4 graphs, it will be understood that only when the E pole side is short circuited (FIG. 10) the condition where plasma density in the E pole side is conventionally lowered can be corrected.

Figure 14:
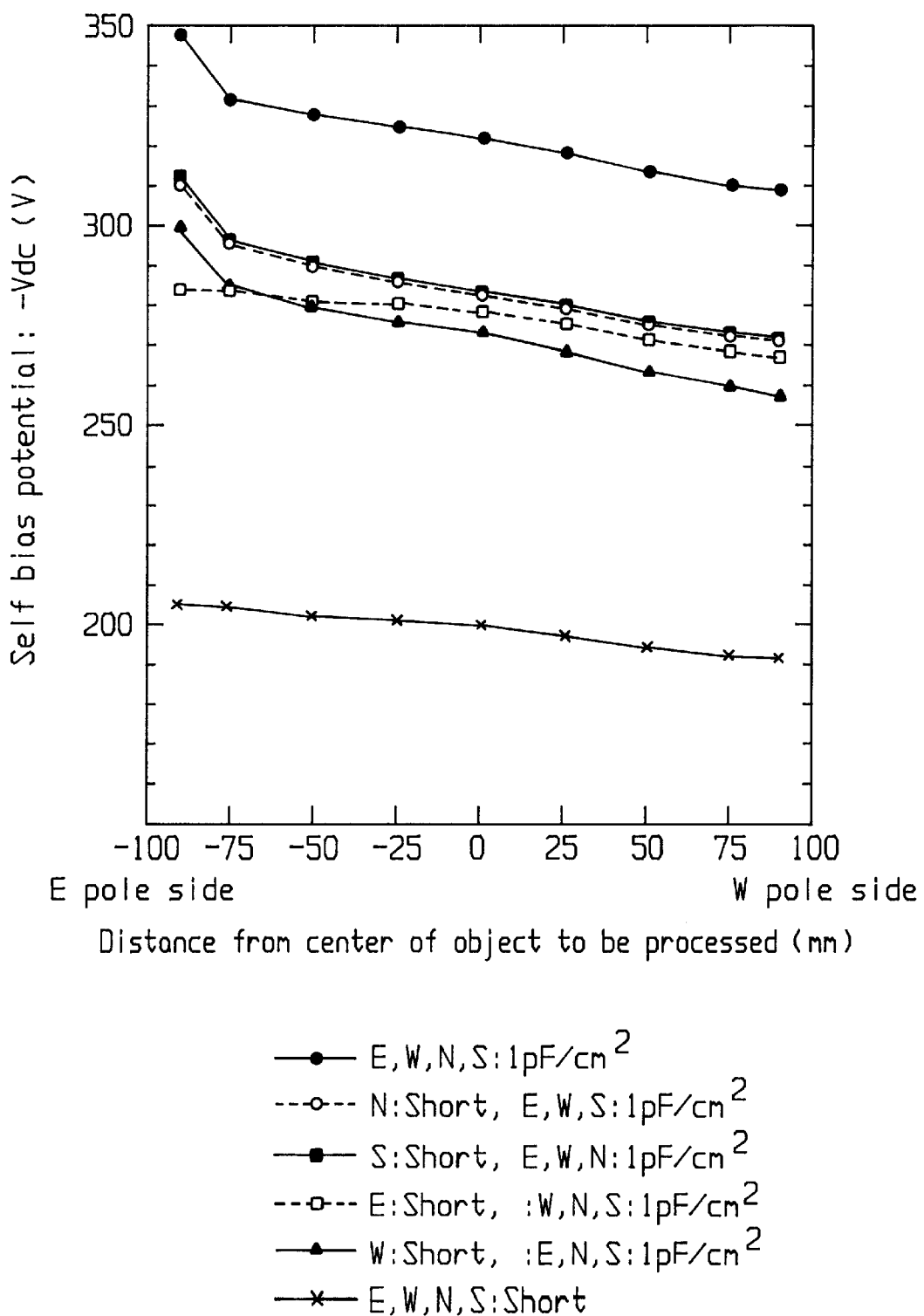
FIG. 14 is a graph collectively showing self bias potential for each of the conditions of FIG. 10–FIG. 13.
Figure 15:
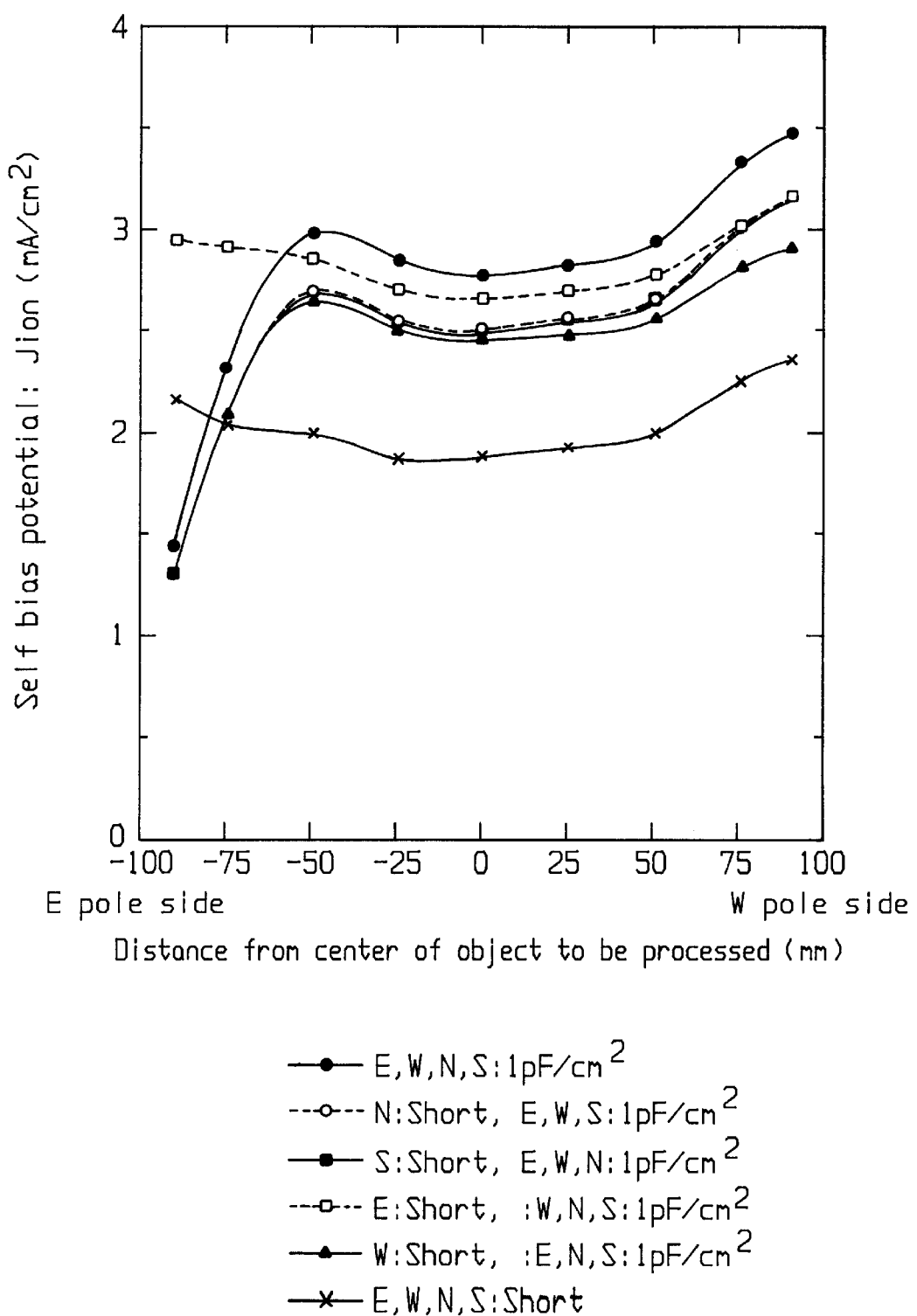
FIG. 15 is a graph collectively showing the results of plasma density shown in FIG. 10–FIG. 13.

FIG. 14 shows results of evaluating self bias potential (Vdc[volt]) for a wafer. FIG. 15 is a graph showing collated results of the plasma densities (Jion[mA/cm$^2$]) shown in FIG. 10–FIG. 13.

From FIG. 14 it will be understood that in the case where all the local electrodes are caused to be short circuited (a condition corresponding to the device of the related art), Vdc becomes small and etching rate becomes low. On the other hand, it will be clearly understood from FIG. 14 and FIG. 15 that in the case where only the E pole side local electrode (302e) is made a cathode, a result is obtained where together with a Vdc of a certain size being obtained, plasma density that would have been lowered in the conventional E pole side can be corrected. Specifically, it will be understood that the above results are achieved by providing, for the base, an auxiliary electrode comprised of local electrodes and impedance adjusting means at least at an upstream side (E pole side) of an electron flow caused by magnetic field applying means.

Embodiment 2

This embodiment is different from embodiment 1 in that plasma density (Jion[mA/cm$^2$]) and self bias potential (Vdc [volt]) were studied using capacitors of various capacitance as the means 104e for adjusting the junction impedance of the E pole side. Cases where the capacitance of the capacitor was 1, 7, 11 and 21 [pF] and the case where the capacitor was short circuited (first embodiment) were compared.

At this time, the other three means for adjusting junction impedance (104w, 104n and 104s) were put in an electrically floating state.

The remaining points are the same as in embodiment 1.

Figure 16:
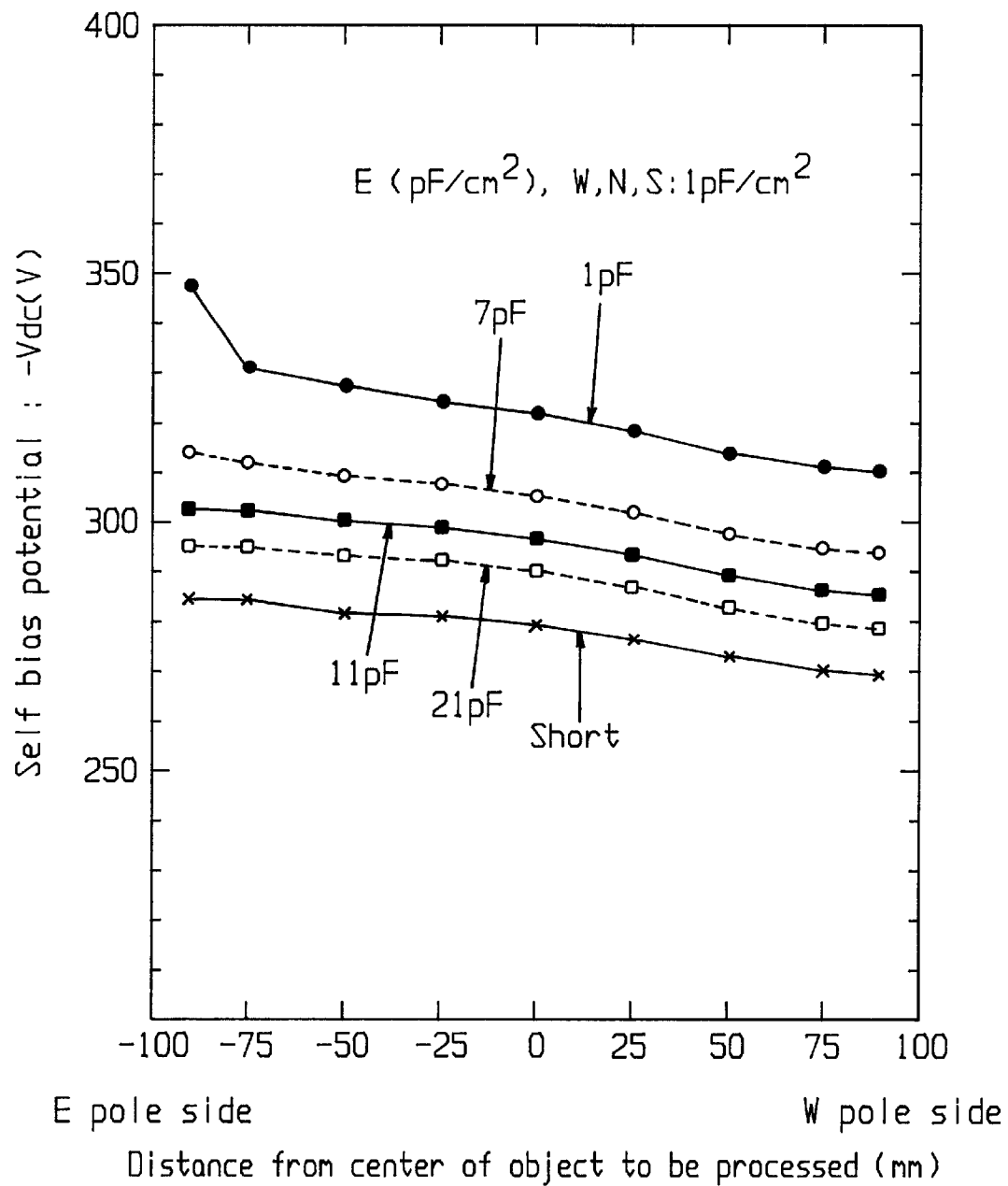
FIG. 16 is a graph showing self bias potential observed in the case of using capacitors of various capacitance as means for adjusting impedance of the E pole side.
Figure 17:
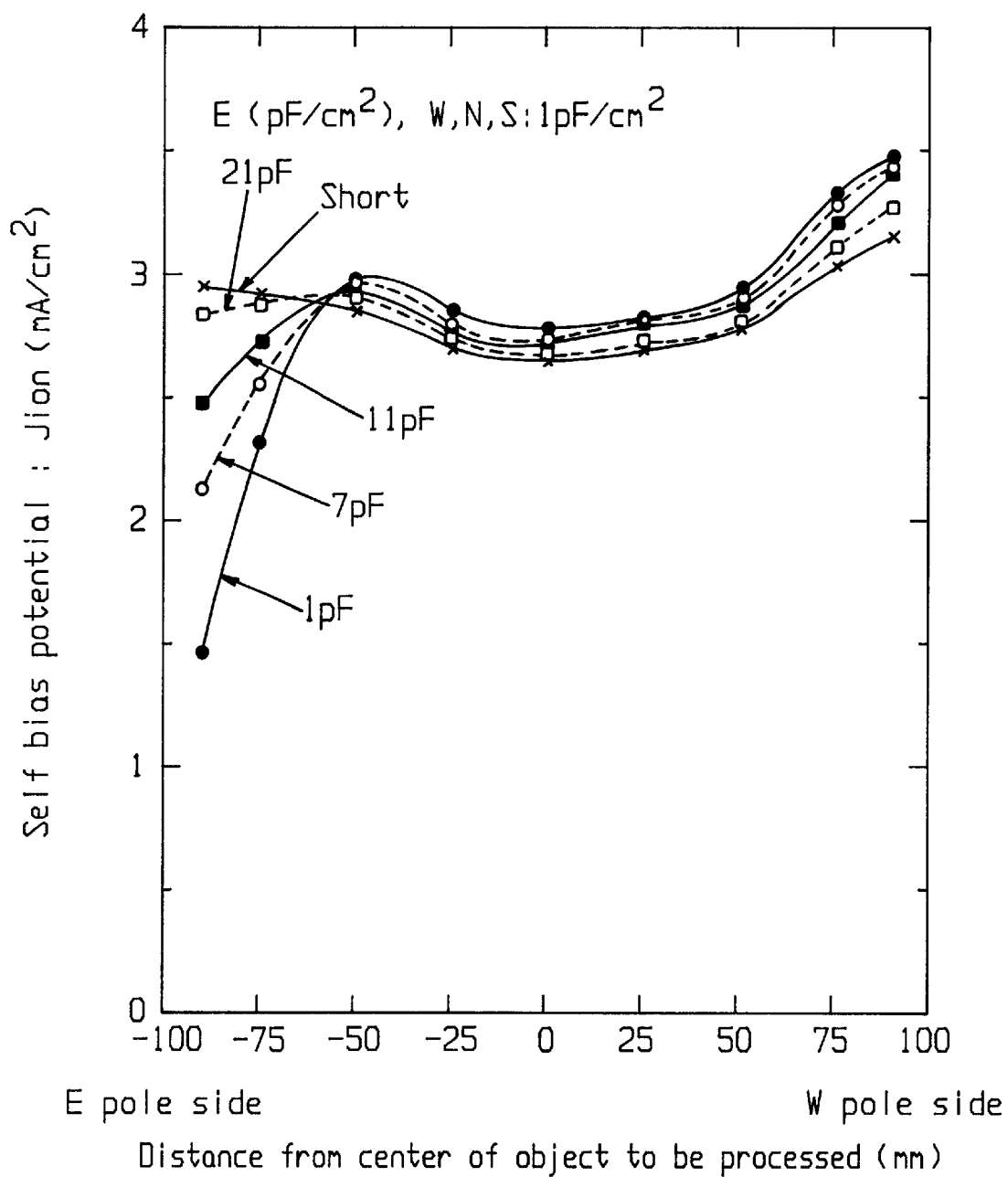
FIG. 17 is a graph showing plasma density observed in the case of using a capacitors of various capacitance as means for adjusting impedance of the E pole side.

FIG. 16 shows results of evaluating self bias potential (Vdc) for a wafer, while FIG. 17 shows results of evaluating plasma density (Jion[mA/cm$^2$]).

From these two graphs it will be understood that that by making the junction impedance of the E pole side an optimum value (21[pF]), Vdc higher than the case for short circuit is attained, and lowering of plasma density that would have occurred in the conventional E pole side can be corrected.

Embodiment 3

In this embodiment, Vdc observed when the portion of the electrode II to which high frequency power (100[MHz]) is applied was changed was evaluated.

The remaining points were the same as for the conditions of embodiment 1 (only E pole side was made cathode).

Figure 18:
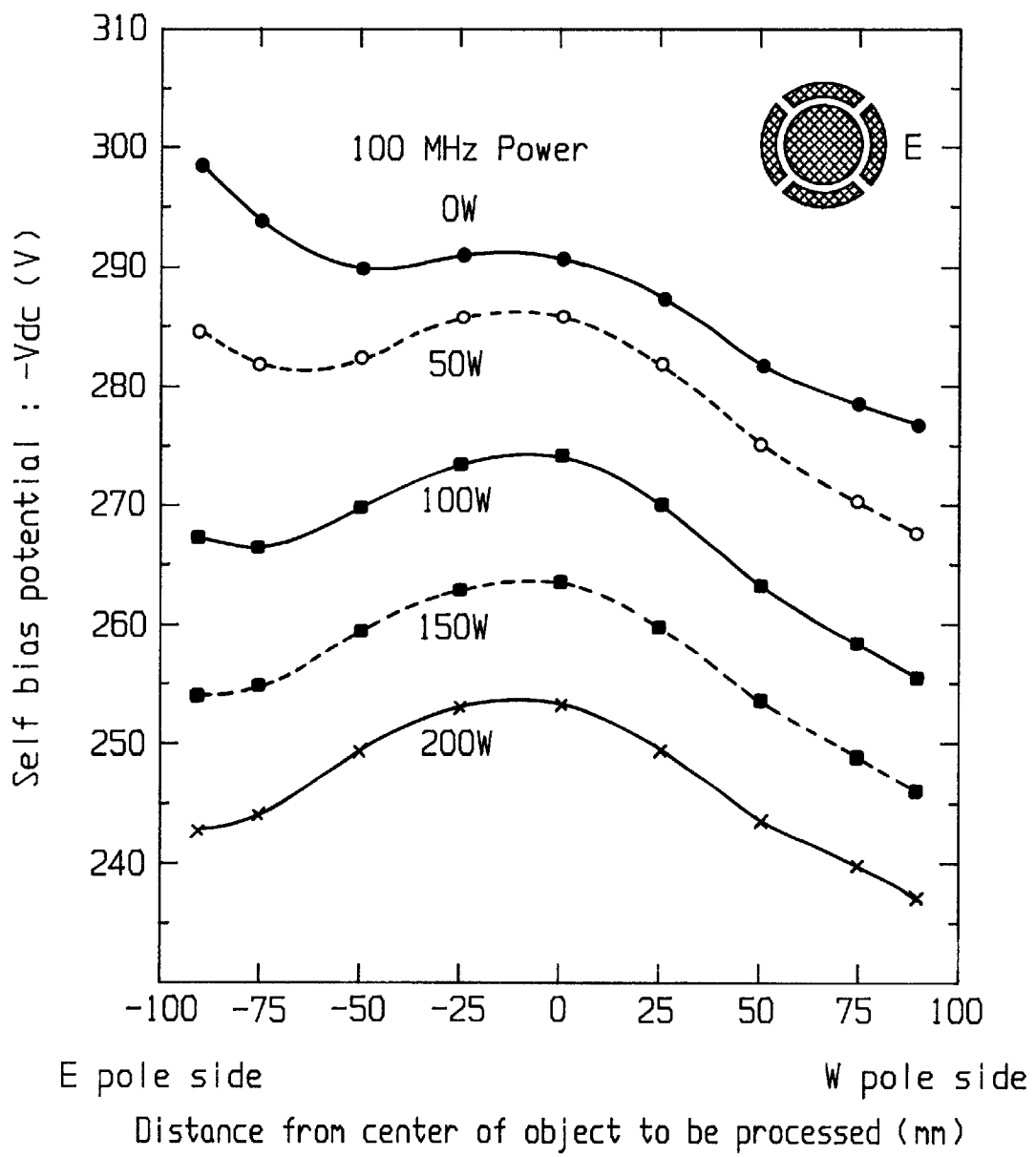
FIG. 18 is a graph showing results of Vdc observed in the case where high frequency is only applied to the all surfaces (106 and 107) of the electrode II.
Figure 19:
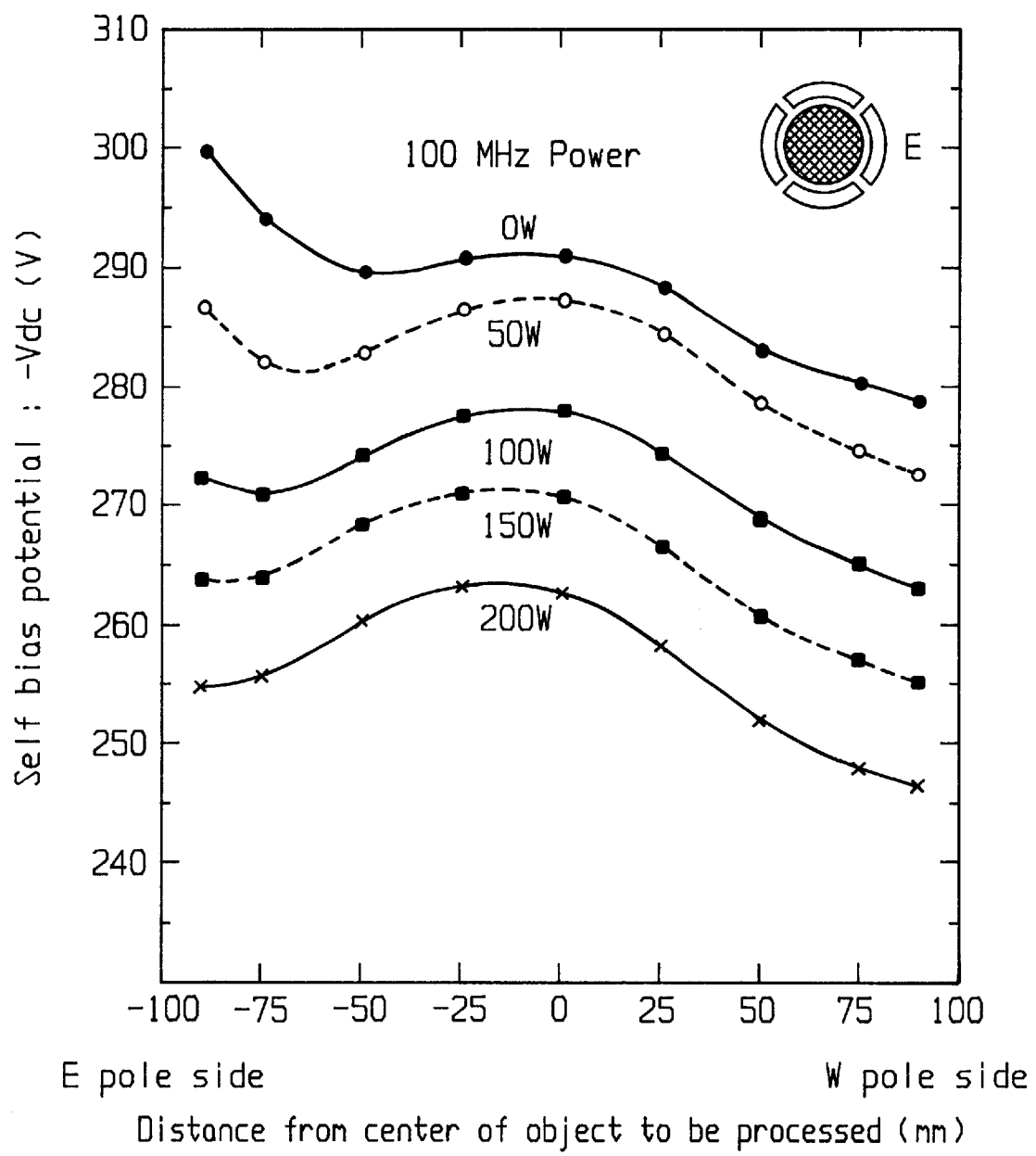
FIG. 19 is a graph showing results of Vdc observed in the case where high frequency is only applied to a central section (106) of the electrode II.
Figure 20:
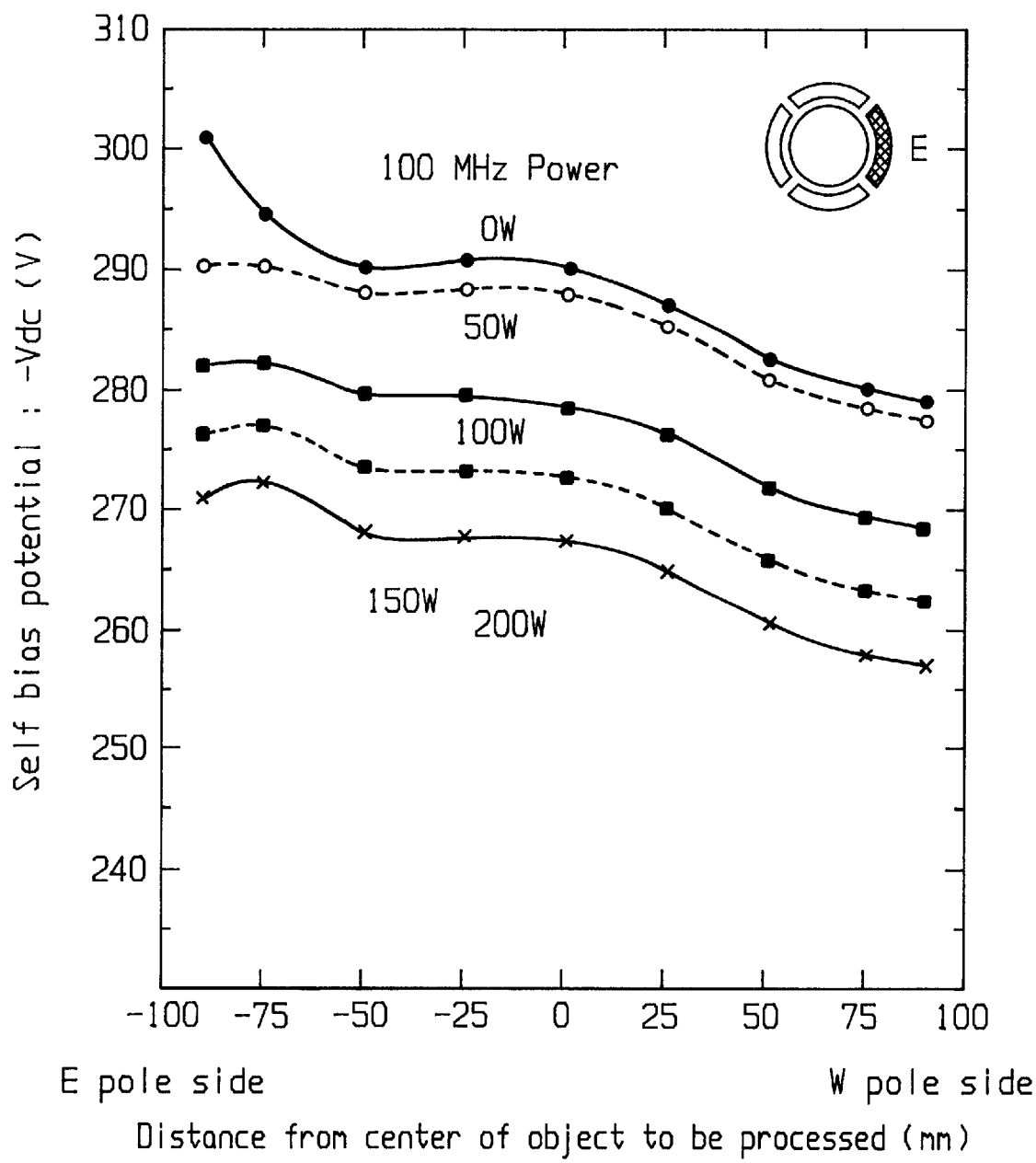
FIG. 20 is a graph showing results of Vdc observed in the case where high frequency is only applied to an E pole side outer electrode (107e) of the electrode II.

FIG. 18 is a graph showing results for the case of application to all surfaces (106 and 107) of electrode II, FIG. 19 is a graph showing results for the case of application to only a central portion (106) of the electrode II, FIG. 2 is a graph showing results for the case of application to only an outer portion (107e) of the E pole side, and FIG. 20 is a graph showing results for the case of application to all outer electrodes (107). A schematic drawing of the electrode II is shown in the upper right corner of each drawing, and the blacked out sections of this schematic indicate portions of the electrode to which high frequency is applied.

Figure 21:
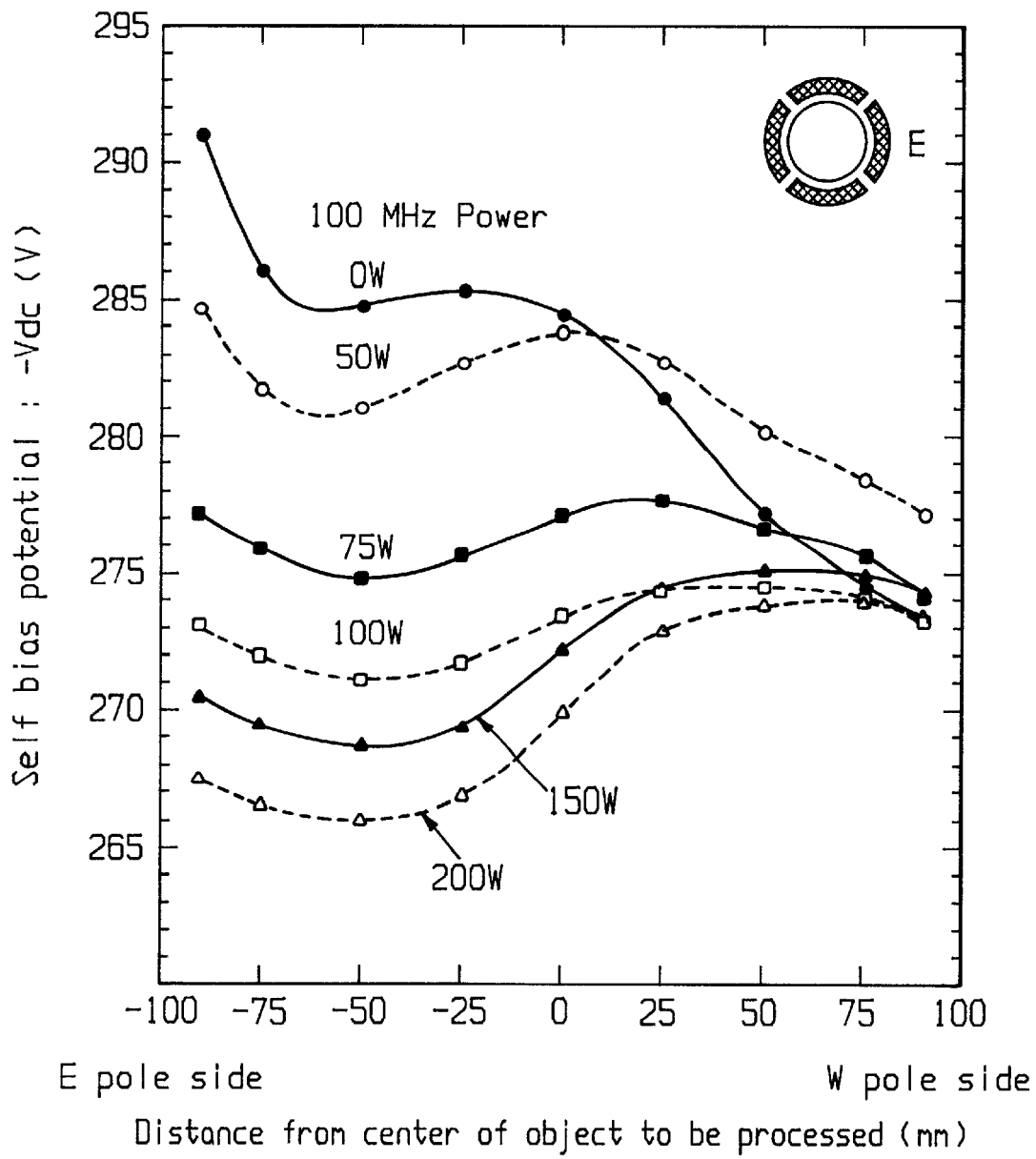
FIG. 21 is a graph showing results of Vdc observed in the case where high frequency is applied to all outer electrodes (107) of the electrode II.

In FIG. 18 and FIG. 19, there was no dependence on the value of applied power, variations in Vdc were large, and no effect of applying high frequency could be seen. In FIG. 20, there was a tendency for variations in Vdc to be smaller compared to FIG. 18 and FIG. 19. In the case of FIG. 21, it will be understood that it was possible to significantly reduce variations in Vdc. Specifically, it was confirmed that by applying high frequency power to all outer electrodes (107), it was possible to suppress variations in Vdc.

Also from FIG. 21, compared to the case where high frequency was not applied to the electrode II (FIG. 21, 0W), in which Vdc had variations of more than 20V and there was a risk of charge up damage to the end surface of the base, in the case where high frequency is applied to all outer electrodes (107) of electrode II (FIG. 21, 75W) variations in Vdc could be restricted to 3V which means that charge up damage can be reduced significantly.

Figure 22:
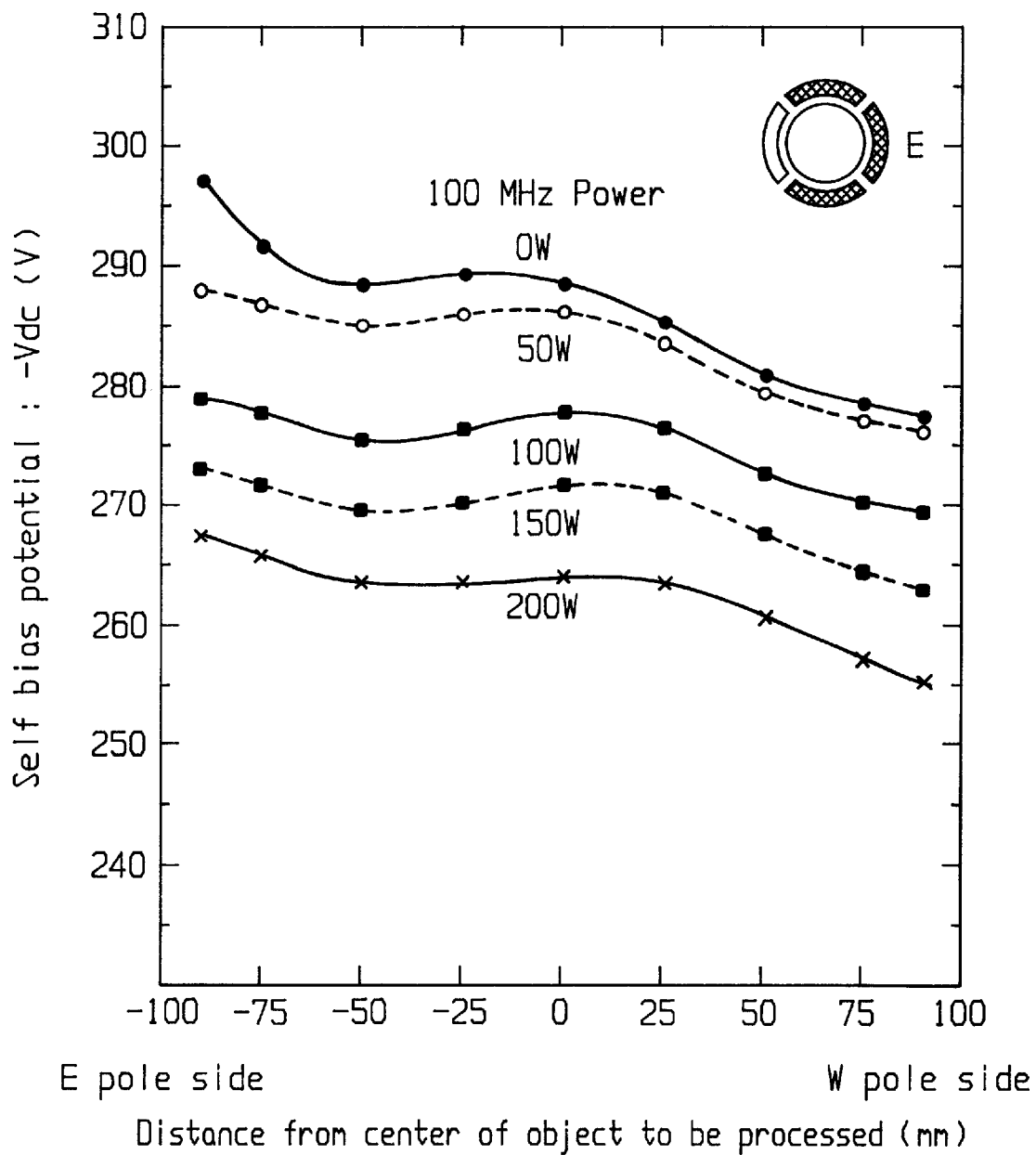
FIG. 22 is a graph showing results of Vdc observed in the case where high frequency is applied to all outer electrodes of the electrode II except a W pole side outer electrode (107w).

FIG. 22 shows results for the case of application to only the W pole side outer electrode (107w). Since this result has the same levels as for the case of application to only the E pole side outer electrode (107e) shown in FIG. 20, it can be considered that application to all outer electrodes (107) is essential in order to suppress variations in Vdc.

In this embodiment, high frequency power of 13.56 [MHz] is applied to the electrode I while high frequency power of 100[MHz] is applied to the outer section of the electrode II, but since the electrode II plays a role of regulating generated plasma (functions as means for adjusting the self bias potential Vdc of the wafer ), a frequency that is higher than the frequency (f1) of the high frequency applied to the electrode I is used as the frequency (f2) of the high frequency applied to the electrode II. As a result of this, Vdc correction effects can be obtained with a small input power. In the case where f2 is a higher frequency than f1, it becomes difficult to sputter electrode II because Vdc for electrode II becomes small. Also, in the case where the frequencies are the same (f2=f1), since electrode I and electrode II interfere with each other, plasma becomes unstable which is not desirable. However, it is possible to cause the plasma to be stable even when f2=f1, by using a device to shift the phase of f1 and f2, etc.

Embodiment 4

In this embodiment, in the device of FIG. 1 distribution of plasma density: Ji on the base mounted on electrode I (101) was studied while altering the shape of the local electrode (103) formed of a conductive material comprising an auxiliary electrode (102) provided at least on an upstream side of a flow of electrons caused by magnetic field applying means and altering the relative arrangement of the disc-shaped base, and investigation was undertaken with regard to the uniformity of plasma distribution. In this case, the shape of the local electrode (103) was arc shaped in accordance with the disc-shaped base. Here, a straight line distance between both base (108) side end sections of the local electrode (103) comprising the auxiliary electrode (102) is defined as L, and the diameter of the base (108) is defined as D. Specifically, in this embodiment a wafer having a diameter D of 200 mm was used as the base.

Changing of the relative arrangement of the local electrode (103) and the base (108) was done by changing the length L of the arc shape of the local electrode opposite to the base, and verification was carried out for the following four arrangements (FIG. 29(a)–FIG. 29(d)).

Figure 29A:
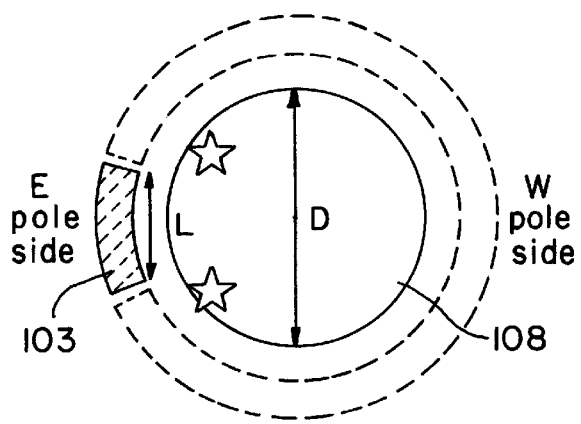
FIG. 29 is a schematic plan view showing the relative quadruplicate arrangement of the local electrode 103 and the base 108.

Arrangement 4-1: the case where the length L of the arc shape of the local electrode opposite the base is shorter than the diameter D of the base (FIG. 29(a)).

Figure 29B:
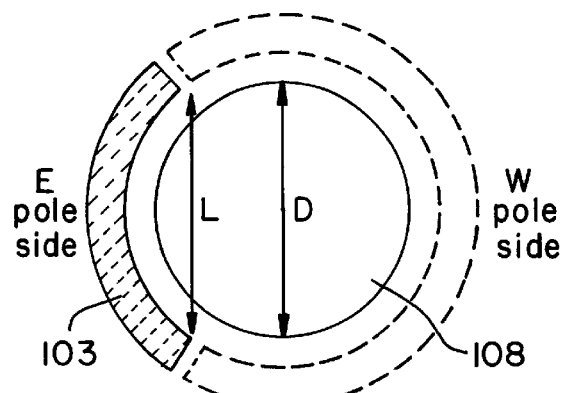

Arrangement 4-2:
the case where the length L of the arc shape of the local electrode opposite the base is almost the same as the diameter D of the base (FIG. 29(b)).

Figure 29C:
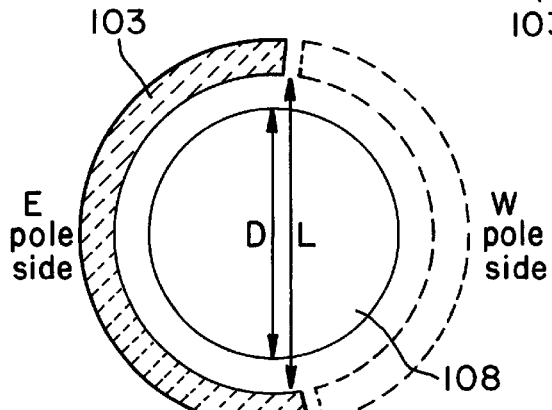

Arrangement 4-3:
the case where the length L of the arc shape of the local electrode opposite the base is longer than the diameter D of the base (FIG. 29(c)).

Figure 29D:
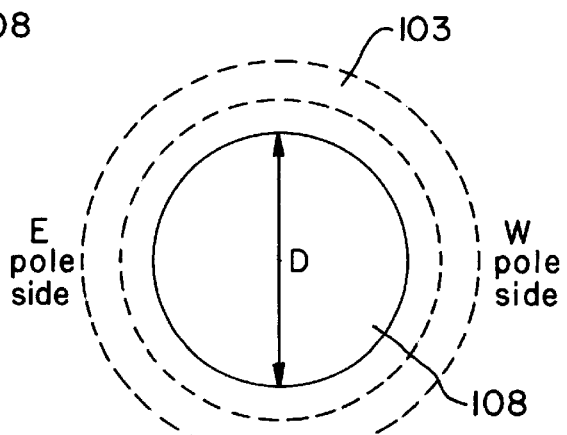

Arrangement 4—4:
the case where the auxiliary electrode is not provided, as in the device of the related art (FIG. 29(d)).

Figure 30:
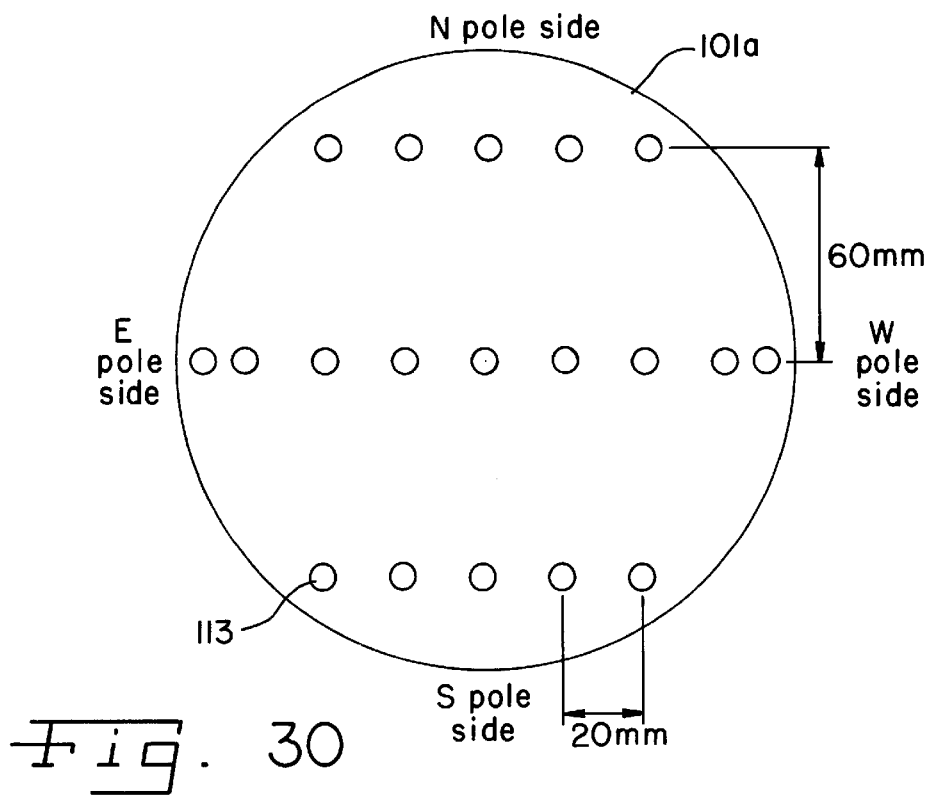
FIG. 30 is a schematic plan view of the electrode I looking from the electrode II side, and is for describing a probe arrangement.

In the measurement of Ji described above, probes provided on a section of the electrode I on which the base is mounted (susceptor: 101a), as shown in FIG. 30 (schematic plan view of electrode I looking from the electrode II side), were used (positions shown by the mark ○ in the drawings). Namely, the probes were arranged in three stages in straight lines from at least an upstream side (E pole side) of a flow of electrons generated by magnetic field applying means 109 to a downstream side (W pole side), at 20 mm intervals. Intervals between the three stages was 60 mm, and they were arranged so that the measurement line of the central stage passed through the center of the base. The number of probes disposed was 9 in the central stage, and 5 each in the upper stage (N pole side) and the lower stage (S pole side).

In this case, it is necessary for a distance between the local electrode (103) and a section of the electrode I on which the base was mounted to be longer than a distance at which an electrical short would occur, and shorter than a distance at which movement of ions generated at the local electrode does not reach the base, and in this embodiment was made 1 mm.

Also, a distance between electrode I (101) and electrode II (105) was preferably a distance at which a ratio between a minimum value and a maximum value of local plasma density generated within a space sandwiched between the electrode I and the electrode II becomes at least 0.1, but in this embodiment it was made 30 mm. This prevented the occurrence of a space where plasma density was extremely low.

The remaining points were the same as for the conditions of embodiment 1 (only E pole side was made cathode).

FIG. 31(a) to FIG. 31(d) are graphs showing results of measuring plasma density Ji for the above described four arrangements. FIG. 31(a) to FIG. 31(d) show results for arrangement 4-1 to arrangement 4-4. In FIG. 31, the horizontal axis is the position at which the probes are arranged, while the vertical axis is self bias potential: Vdc. The three marks shown in the graphs have the following meaning. The mark Δ represents results of the upper stage measurement line, the mark □ represents results of the middle stage measurement line, and the mark ▽ represents results of the lower stage measurement line.

From FIG. 31(a) to FIG. 31(D), the following points become clear.

1) Compared to arrangement 4—4 (the case where the local electrode is not provided (FIG. 29(d)), the arrangements 4-1 to 4-3 (FIG. 29 (a)–FIG. 29(c)) having the local electrode (103) provided at least upstream exhibit uniform plasma density for the middle measurement line. Specifically, in the case of arrangement 4-1 (FIG. 29(a)) where the length L of the arc shape of the local electrode opposite the base is shorter than the diameter D of the base, it was confirmed that plasma density was lower at the position of mark ☆.

2) In arrangements 4-2 and 4-3 (FIG. 29(b) and FIG. 29(c)) where the length L of the arc shape of the local electrode opposite the base is respectively the same as and larger than the diameter D of the base, there was uniform plasma density for the upper and lower measurement lines, from which it will be understood that it is possible to generated uniform and stable plasma over the entire surface of the base.

Embodiment 5

Figure 32:
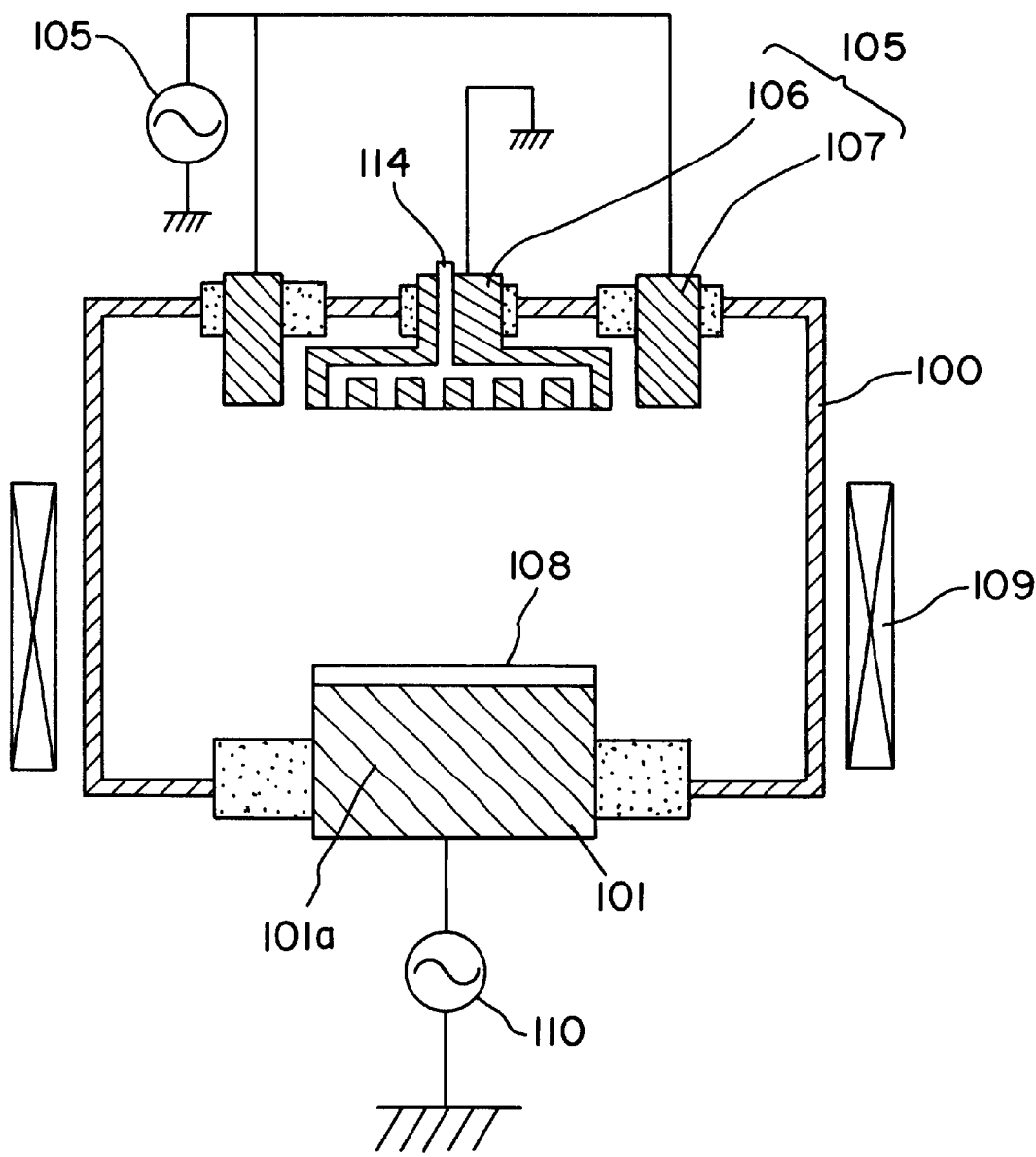
FIG. 32 is a schematic cross sectional view of a parallel plate type plasma etching device without an auxiliary electrode, to which embodiment 5 relates

In this embodiment, a parallel plate type plasma etching device with no auxiliary electrode, as shown in FIG. 32, was used in place of the device of FIG. 1, and distribution of self bias potential (Vdc) on the base mounted on electrode I (101) was investigated while altering the relative arrangement of electrode II (105), having separated central section (106) and outer section (107), and electrode I (101), and uniformity of the self bias potential was studied. In FIG. 32, reference numeral 100 is a chamber, reference numeral 101 is electrode I, reference numeral 101a is a section of electrode I on which a base is mounted (susceptor), reference numeral 105 is electrode II, reference numeral 106 is a central electrode, reference numeral 107 is an outer electrode, reference numeral 108 is a base, reference numeral 109 is magnetic field applying means, reference numeral 110 is a power source for applying high frequency to electrode I, and reference numeral 105 is a power source for applying high frequency to outer electrode constituting electrode II.

Here, as shown in FIG. 36(a), an integral member 107a having the uniform impedance is used as the outer electrode constituting the electrode II.

In this case, a frequency of 13.56 MHz was applied to electrode I (101) and a frequency of 100 MHz was applied to electrode II (107), and the Vdc distribution on the base was studied for plasma generated when the central electrode (106) of the electrode II was set to an earth potential.

The following six arrangements (FIG. 33(a) to FIG. 33(e)) were verified by changing the relative positions of the electrode II (105) and the electrode I (101) by changing the diameter of the central electrode (106), and the width of the outer electrode (107).

Figure 33A:
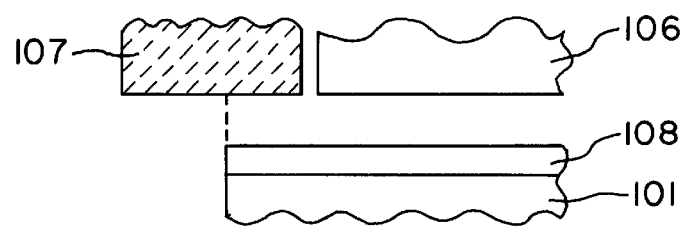
FIG. 33 is a schematic cross sectional view showing the relative sextuple arrangement of electrode II (105) and electrode I(101) to which embodiment 5 relates.

Arrangement 5-1:
the case where the outer end of electrode I (101) is in the vicinity of the middle of the outer electrode (107) constituting electrode II (105) (FIG. 33(a)).

Figure 33B:
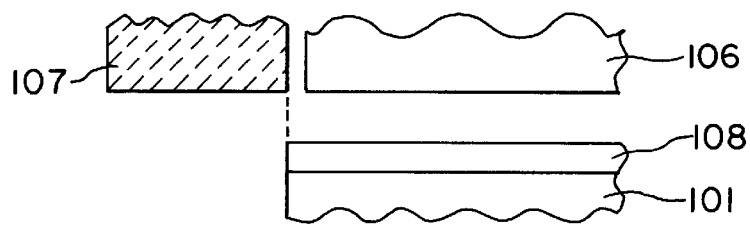

Arrangement 5-2:
the case where the outer end of electrode I (101) is in the vicinity of the inner end of the outer electrode (107) constituting electrode II (105) (FIG. 33(b)).

Figure 33C:
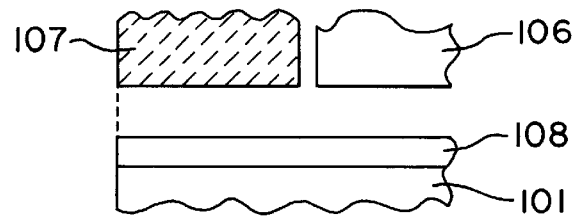

Arrangement 5-3:
the case where the outer end of electrode I (101) is in the vicinity of the outer end of the outer electrode (107) constituting electrode II (105) (FIG. 33(c)).

Figure 33D:
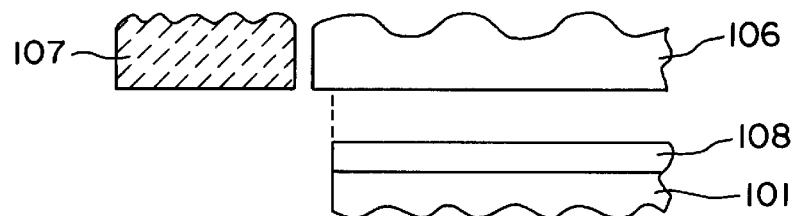

Arrangement 5-4:
the case where the outer end of electrode I (101) is further in than the outer end of the central electrode (106) constituting electrode II (105) (FIG. 33(d)).

Figure 33E:
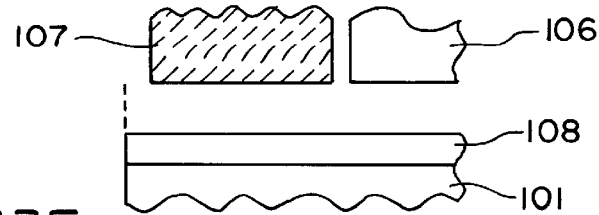

Arrangement 5-5:
the case where the outer end of electrode I (101) is further out than the outer end of the outer electrode (106) constituting electrode II (105) (FIG. 33(e)).

Figure 33F:
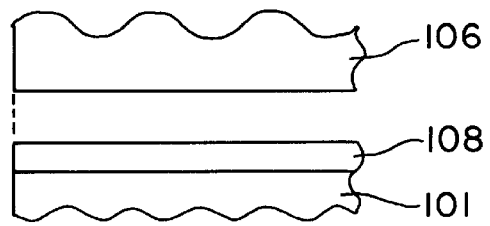

Arrangement 5-6:
the case where the electrode II (105) comprises only a central electrode (106), and the outer end of the electrode I (101) is in the vicinity of the outer end of the central electrode (106) constituting the electrode II (105), the same as the device of the related art (FIG. 33(f)).

Figure 34:
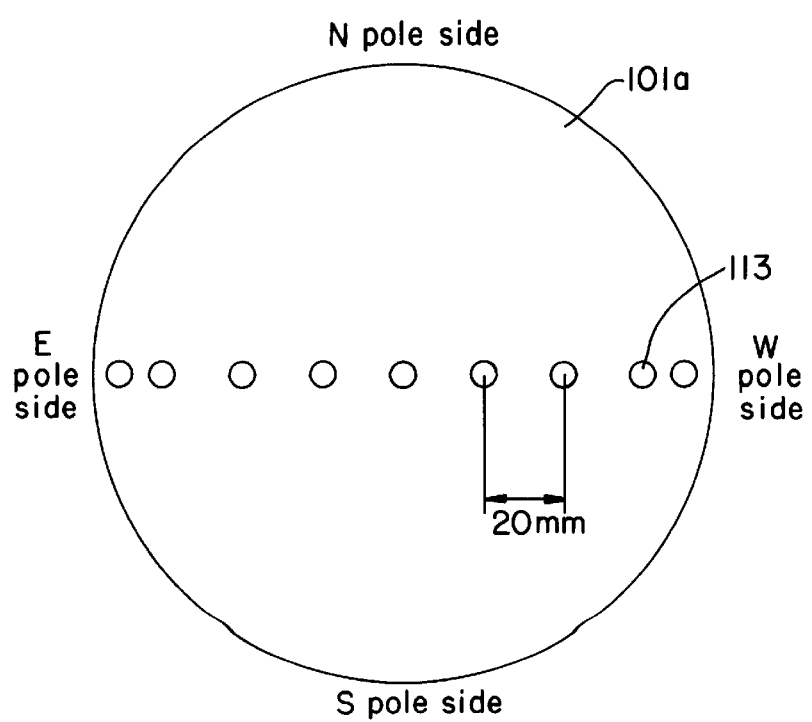
FIG. 34 is a schematic plan view of electrode I looking from the electrode II side, and is used to described a probe arrangement.
Figure 31A:
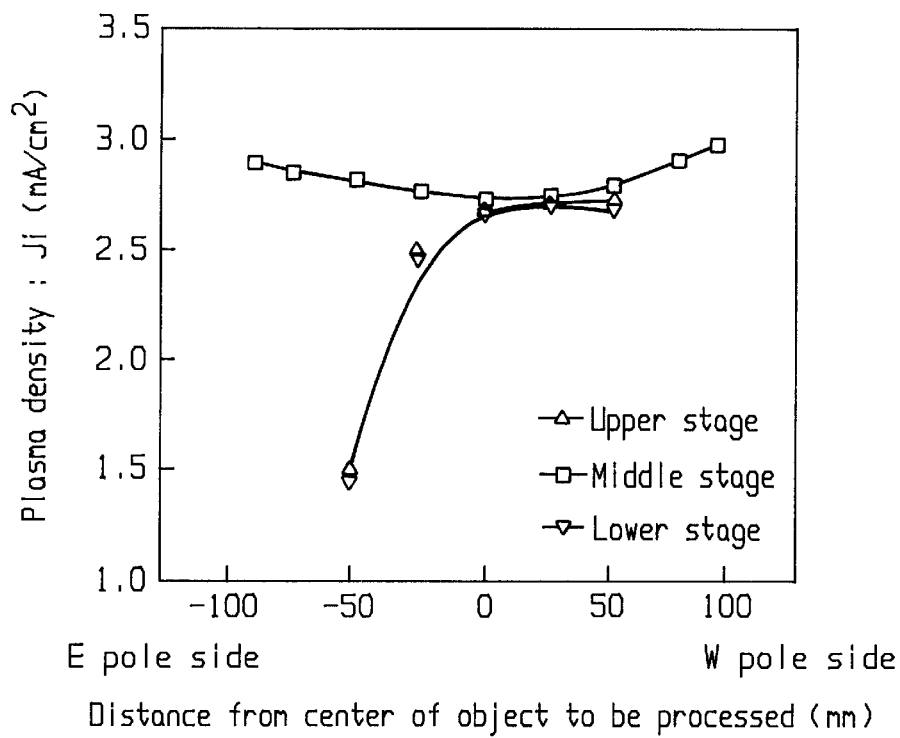
FIGS. 31A–31D graphs giving results of measuring plasma density Ji, to which embodiment 4 relates.
Figure 31B:
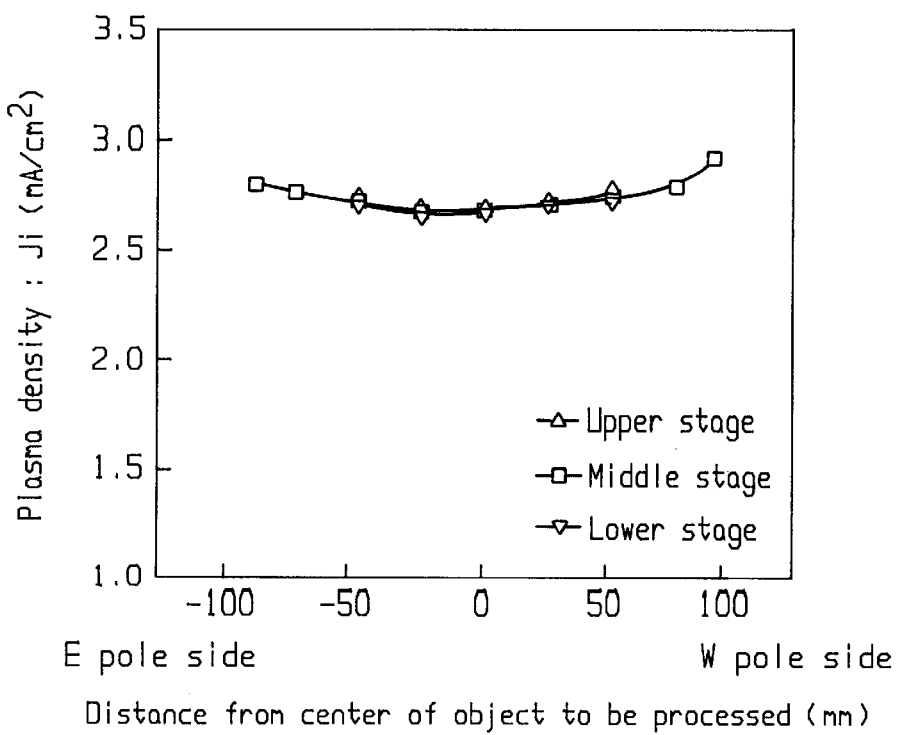
Figure 31C:
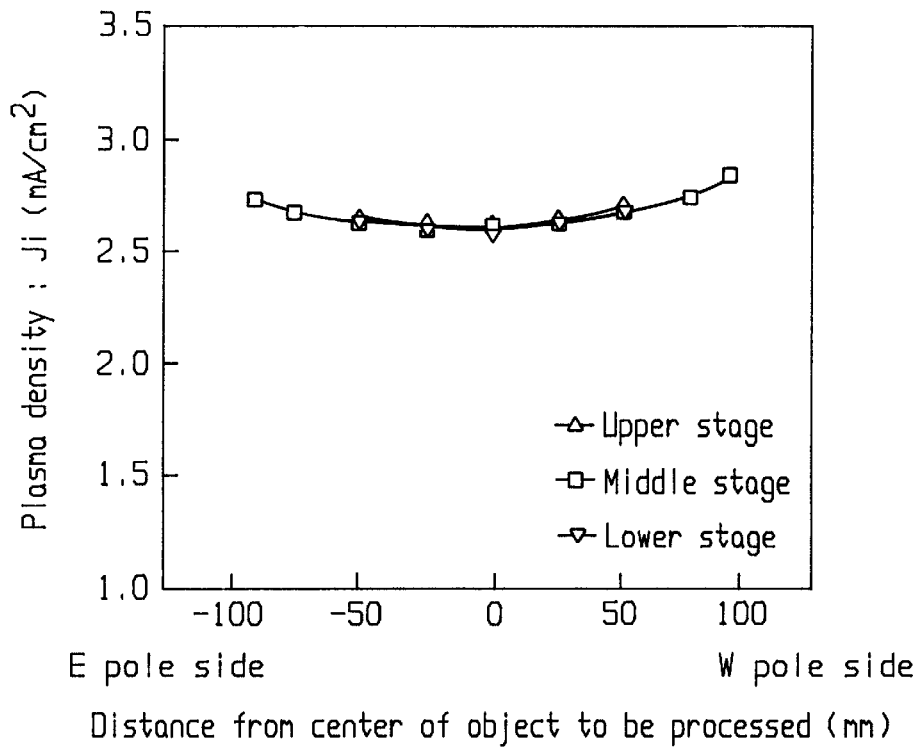
Figure 31D:
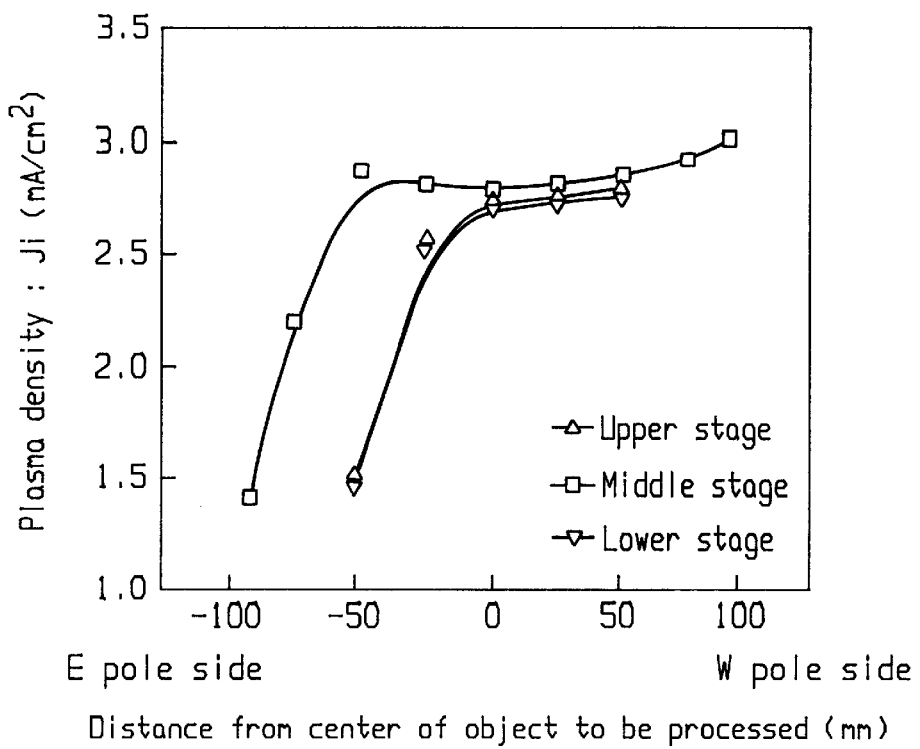

In the measurement of Vdc described above, probes provided on a section of the electrode I on which the base is mounted (susceptor: 101a), as shown in FIG. 34 (schematic plan view of electrode I looking from the electrode II side), were used (positions shown by the mark ○ in the drawings). Specifically, nine probes were arranged in a straight line at intervals of 20 mm from at least an upstream side (E pole side) of an electron flow generated by magnetic field applying means 109, to a downstream side (W pole side).

In this case, the interval between the central electrode (106) constituting electrode II (105) and the outer electrode (107) constituting electrode It must be longer than a distance at which electrical shorting would occur, and in this embodiment is 1 mm.

Also, a distance between electrode I (101) and the outer section (107) of electrode II was preferably a distance at which a ratio between a minimum value and a maximum value of local plasma density generated within a space sandwiched between the electrode I and the electrode II becomes at least 0.1, and in this embodiment it was made 30 mm. This prevented the occurrence of a space where plasma density was extremely low.

Figure 35:
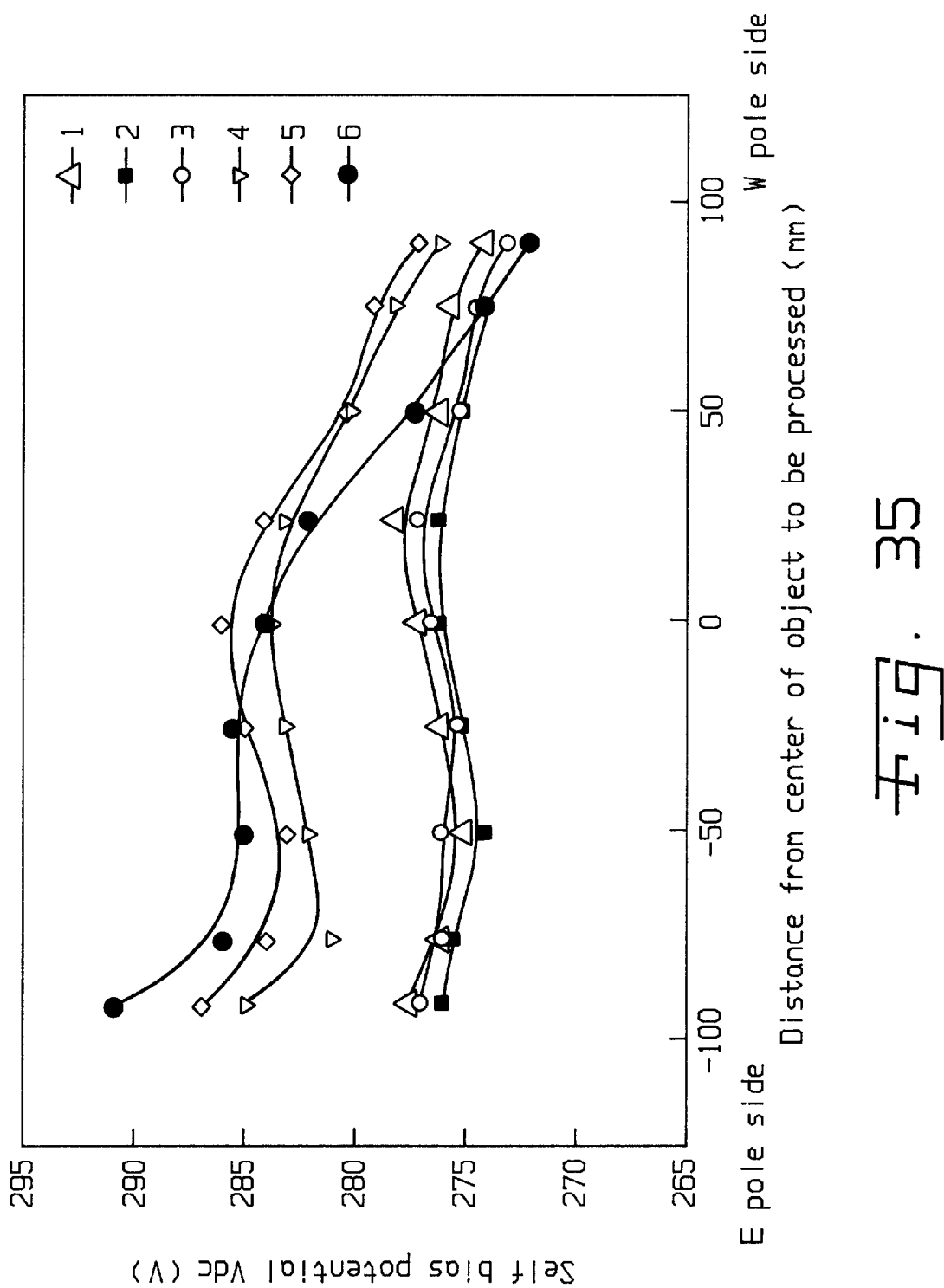
FIG. 35 is a graph showing results of measuring self bias potential: Vdc, to which embodiment 5 relates.

FIG. 35 is a graph showing results of measuring self bias potential (Vdc) for the above described six arrangements. In FIG. 35, the mark Δ represents arrangement 5-1, the mark ■ represents arrangement 5-2, the mark ○ represents arrangement 5-3, the mark ▽ represents arrangement 5-4, the mark represents arrangement 5-5, and the mark x represents arrangement 5-6.

The following points become clear from FIG. 35.

1) with arrangements 5-1 to 5-5 provided with an outer electrode to which high frequency is applied, Vdc is uniform in a direction from the E pole side to the W pole side, and the Vdc distribution is less than approximately 10 Volts, compared to arrangement 5–6 (the case where no outer electrode is provided and the electrode II only comprises a central electrode: indicated by the mark x) where Vdc distribution (distance between maximum value and minimum value) is approximately 20 Volts.

2) with arrangements 5-1 to 5-3, having the outer end of electrode I (101) provided within the range of the width of the outer electrode (107) constituting the electrode II (105), it is understood that variations in Vdc from the E pole side to the W pole side can be suppressed to less than approximately 5 volts. As a result, charge up damage to the base can be significantly reduced.

Also, this embodiment has been exemplified by the case where the central electrode of the electrode II is set to an earth potential, but is was confirmed that the same effects as in this embodiment could also be obtained in the case where the central electrode (106) of the electrode II was floating. Accordingly, there is no problem if the central electrode (106) of electrode II is at an earth potential or floating.

Still further, as shown in FIG. 36(*a*), an integral member 107*a* having the uniform impedance, is used as the outer electrode constituting the electrode II, but it was confirmed that the sa me effects as in this embodiment could also be obtained if the outer section 107 constituting the electrode II 105 is a ring body, as shown in FIG. 36(*b*), and a region having a different impedance is provided so that the impedance of this ring body becomes lower at a region 107*b* corresponding to an upstream side (E pole side) of an electro n flow generated by magnetic field applying means, than at the other section (107*c*).

Industrial Applicability

As has been described above, according to the present invention there is provided an auxiliary electrode capable of making the density of plasma generated on the surface of a base uniform.

By providing the auxiliary electrode of the present invention with an outer section of an electrode I on which a base in mounted, it is possible to design a plasma etching device capable of uniform etching and sputtering over the entire surface of a base.

Also, by applying high frequency power to only an outer section of an electride II positioned opposite to the electrode i, it becomes possible to provide a plasma etching device that will make self bias potential of a base uniform.

What is claimed is:

1. An etching device, for etching a base using plasma, said device comprising:

an electrode I and an electrode II, each electrode of a parallel plate type, the base mounted on a surface of electrode I opposite to electrode II;

a means for applying high frequency power connected to at least one of electrode I and/or electrode II; and a means for applying a unidirectional magnetic field that is horizontal with respect to the surface of the base to be subjected to plasma etching, said magnetic field means including an auxiliary electrode at least on an upstream side, with respect to the base, of a flow of electrons generated by the magnetic field applying means, the auxiliary electrode including a local electrode arranged on a side facing the electrode II and means for adjusting impedance provided at a part of the local electrode to be electrically connected with the electrode I so that the upstream side input power effectiveness of the electron flow is increased by said local electrode impedance adjustment means.

2. An etching device, for etching a base using plasma, said device comprising:

an electrode I and an electrode II, each electrode of a parallel plate type, the base mounted on a surface of electrode I opposite to electrode II;

a means for applying high frequency power connected to the electrode I and electrode II; and a means for applying a unidirectional magnetic field that is horizontal with respect to the surface of the base to be subjected to plasma etching, said magnetic field means including an auxiliary electrode at least on an upstream side, with respect to the base, of a flow of electrons generated by the magnetic field applying means, the auxiliary electrode including a local electrode arranged on a side facing the electrode II and means for adjusting impedance provided at a part of the local electrode to be electrically connected with said electrode I; and said electrode II comprising a central portion electrically connected to ground, and an outer portion connected to a high frequency power supply capable of being controlled independently of a high frequency power supply capable of being controlled independently of a high frequency power supply connected to said electrode I so that the upstream side input power effectiveness of the electron flow is increased by said local electrode impedance adjustment means.

3. The plasma etching device as disclosed in any one of claim 1 or claim 2, wherein the magnetic field applying means is a dipole ring magnet (DRM).

4. The plasma etching device as disclosed in claim 1 or claim 2, wherein the local electrode constituting the auxiliary magnet is a first local electrode formed of a conductive material provided only at an upstream side of a flow of electrons caused by said magnetic field applying means.

5. The plasma etching device as disclosed in of claim 1 or claim 2, wherein the local electrode comprising the auxiliary electrode is formed from a combination of a second local electrode formed of a conductive material provided at least at an upstream side of a flow of electrons caused by the magnetic field applying means, and a third local electrode formed of an insulating material provided at a portion other than the upstream side.

6. The plasma etching device as disclosed in claim 1 or claim 2, wherein the local electrode comprising the auxiliary electrode is formed, from a combination of a fourth local electrode formed of a conductive material and being wide at least at an upstream side of a flow of electrons caused by the magnetic field applying means and being narrow at other than the upstream side, and a fifth local electrode formed of an insulating material provided outside a region where the fourth electrode is narrow, looking from the base side.

7. The plasma etching device as disclosed in claim 1 or claim 2, wherein the local electrode comprising the auxiliary electrode provided at least at an upstream side of a flow of electrons caused by the magnetic field applying means is of a size that covers the upstream side of the electron flow, observed from all positions of the base.

8. The plasma etching device as disclosed in claim 1 or claim 2, wherein the means for adjusting junction impedance has an uneven shape at a section of the local electrode to be electrically connected to the electrode I.

9. The plasma etching device as disclosed in claim 1 or claim 2, wherein the means for adjusting junction impedance has an uneven shape at a section of the electrode I to be electrically connected to the local electrode.

10. The plasma etching device as disclosed in claim 1 or claim 2, wherein the means for adjusting junction impedance is provided between the local electrode and the electrode I, and is a single layer film formed of a material having a different dielectric constant from that of the local electrode and the electrode I.

11. The plasma etching device as disclosed in claim 1 or claim 2, wherein the means for adjusting junction impedance is a cavity provided inside the local electrode.

12. The plasma etching device as disclosed in claim 1 or claim 2, wherein the means for adjusting junction impedance is a cavity provided in the vicinity of a boundary between said local electrode and said electrode I.

13. The plasma etching device as disclosed in claim 11, wherein the inside of the cavity is one of a vacuum, an inert gas, or a material having a different dielectric constant from that of the local electrode and said electrode I.

14. The plasma etching device as disclosed in claim 1, or claim 2, wherein the means for adjusting junction impedance is a capacitor provided between the local electrode and the electrode I.

15. The plasma etching device as disclosed in claim 1 or claim 2, wherein the material constituting the local electrode is one of Al, Cu, Si, SiC or glassy carbon.

16. The plasma etching device as disclosed in claim 1 or claim 2, wherein a surface of the local electrode to be exposed to plasma is one of at the same height as a surface of the base, or higher than a surface of the base within a width of an ion sheath.

17. The plasma etching device as disclosed in claim 1 or claim 2, wherein a distance between said local electrode and a section of said electrode I on which the base is mounted is longer than a distance at which electrical shorting takes place, and shorter than a distance at which movement of electrons generated at the local electrode no longer reaches the base.

18. The plasma etching device as disclosed in claim 1, wherein an outer end of the base mounted on said electrode I is located either at the same position as the outer end of said electrode II or inside the outer end of said electrode II.

19. The plasma etching device as disclosed in claim 2 or claim 2, wherein a distance between the outer portion of the electrode II and the electrode I is a distance at which movement of electrons generated on the surfaces of each of the electrode I and the electrode II have an effect on one another.

20. The plasma etching device as disclosed in claim 2, wherein a distance between a central section and an outer section constituting the electrode II is longer than a distance at which electrical shorting occurs.

21. The plasma etching device as disclosed in claim 2, wherein an outer end of the base mounted on the electrode I is located within a range from an outer end to an inner end of an outer section constituting the electrode II.

22. The plasma etching device as disclosed in any one of claims 1 or 2, wherein a shower head comprising introduction pipes numerously arranged in a region of the electrode II that is electrically grounded is used as a structure for introducing process gas within a space sandwiched between the electrode I and the electrode II.

23. The plasma etching device as disclosed in claim 2, wherein, when a base mounted on the electrode I is plasma etched by applying high frequency separately to the electrode I and the electrode II, a relationship between a frequency f1 of high frequency applied to electrode I and a frequency f2 of high frequency applied to electrode II is $f1 \leq f2$.

24. An etching device, for etching a base using plasma, said device comprising:

an electrode I and an electrode II, each electrode of a parallel plate type, the base mounted on a surface of electrode I opposite to electrode II;

a means for applying high frequency power connected to at least one of electrode I and electrode II; and a means for applying a unidirectional magnetic field that is horizontal with respect to the surface of the base to be subjected to plasma etching, comprising an auxiliary electrode of a ring body provided at a peripheral section of the base, the auxiliary electrode including a local electrode arranged on a side facing the electrode II and means for adjusting impedance provided at a part of the local electrode to be electrically connected with the electrode I, and the impedance of the ring body at a section corresponding to an upstream side in an electron flow generated by the magnetic field applying means being lower than at other sections so that the upstream side input power effectiveness of the electron flow is increased by said local electrode impedance adjustment means.

25. A plasma etching device, for etching a base using plasma, said device comprising:

an electrode I and an electrode II, each electrode of a parallel plate type, the base mounted on a surface of electrode I opposite to electrode II;

a means for applying high frequency power connected to the electrode I and electrode II; and the electrode II comprising a central portion electrically connected to ground, and a ring body outer portion connected to a high frequency power supply capable of being controlled independently of a high power supply connected to the electrode I, with the impedance of the ring body at a section corresponding to an upstream side in an electron flow generated by the magnetic field applying means being lower than at other sections so that the upstream side input power effectiveness of the electron flow is increased by said local electrode impedance adjustment means.

26. The plasma etching device as disclosed in claim 12, wherein the inside of the cavity is one of a vacuum, an inert gas, or a material having a different dielectric constant from that of the local electrode and said electrode I.

* * * * *